(12) United States Patent
Ohsawa et al.

(10) Patent No.: US 9,257,657 B2
(45) Date of Patent: *Feb. 9, 2016

(54) LIGHT EMITTING DEVICE AND ELECTRONIC APPLIANCE USING THE SAME

(75) Inventors: Nobuharu Ohsawa, Kanagawa (JP); Hideko Inoue, Kanagawa (KR); Satoshi Seo, Kanagawa (JP); Satoko Shitagaki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 141 days.

This patent is subject to a terminal disclaimer.

(21) Appl. No.: 13/156,506

(22) Filed: Jun. 9, 2011

(65) Prior Publication Data
US 2011/0298360 A1    Dec. 8, 2011

Related U.S. Application Data

(63) Continuation of application No. 11/431,648, filed on May 9, 2006, now Pat. No. 7,960,038.

(30) Foreign Application Priority Data

May 20, 2005    (JP) .................................. 2005-148777

(51) Int. Cl.
*H05B 33/14*    (2006.01)
*H01L 51/00*    (2006.01)
(Continued)

(52) U.S. Cl.
CPC ............ *H01L 51/0085* (2013.01); *C09K 11/06* (2013.01); *H01L 51/009* (2013.01);
(Continued)

(58) Field of Classification Search
None
See application file for complete search history.

(56) References Cited

U.S. PATENT DOCUMENTS 6,734,457 B2    5/2004    Yamazaki et al.
6,803,720 B2    10/2004    Kwong et al.
(Continued)

FOREIGN PATENT DOCUMENTS

JP    2004-515895    5/2004
JP    2005-314414    11/2005
(Continued)

OTHER PUBLICATIONS

Machine English translation of JP 2005-314414 A. May 15, 2012.*
(Continued)

*Primary Examiner* — J. L. Yang
(74) *Attorney, Agent, or Firm* — Husch Blackwell LLP

(57) ABSTRACT

The light emitting element includes a first electrode and a second electrode, between which a light emitting layer, a hole transporting layer provide in contact with the light emitting layer, an electron transporting layer provided in contact with the light emitting layer, and a mixed layer provided between the electron transporting layer and the second electrode. The mixed layer includes an electron transporting substance and a substance showing an electron donating property with respect to the electron transporting substance. The light emitting layer includes an organometallic complex represented in General Formula (1) and a host. $R^1$ and $R^2$ each represent an electron-withdrawing substituent group. $R^3$ and $R^4$ each represent any of hydrogen or an alkyl group having 1 to 4 carbon atoms. L represents any of a monoanionic ligand having a beta-diketone structure, a monoanionic bidentate chelating ligand having a carboxyl group, or a monoanionic bidentate chelating ligand having a phenolic hydroxyl group.

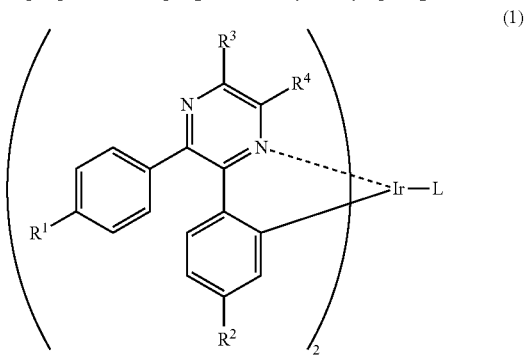

(1)

17 Claims, 22 Drawing Sheets

(51) Int. Cl.
*C09K 11/06* (2006.01)
*H01L 51/50* (2006.01)

(52) U.S. Cl.
CPC ....... *H05B 33/14* (2013.01); *C09K 2211/1022* (2013.01); *C09K 2211/1029* (2013.01); *C09K 2211/1044* (2013.01); *C09K 2211/185* (2013.01); *H01L 51/5016* (2013.01); *H01L 51/5052* (2013.01)

(56) References Cited

U.S. PATENT DOCUMENTS

| | | | |
|---|---|---|---|
| 7,960,038 B2 * | 6/2011 | Ohsawa et al. | 428/690 |
| 2001/0045565 A1 | 11/2001 | Yamazaki | |
| 2002/0024293 A1 | 2/2002 | Igarashi et al. | |
| 2002/0086180 A1 * | 7/2002 | Seo et al. | 428/690 |
| 2002/0101154 A1 | 8/2002 | Seo et al. | |
| 2005/0214576 A1 | 9/2005 | Lamansky et al. | |
| 2005/0221123 A1 | 10/2005 | Inoue et al. | |
| 2005/0280008 A1 * | 12/2005 | Ricks et al. | 257/79 |
| 2009/0015143 A1 | 1/2009 | Inoue et al. | |
| 2009/0123720 A1 | 5/2009 | Chen et al. | |
| 2009/0206732 A1 | 8/2009 | Seo et al. | |

FOREIGN PATENT DOCUMENTS

| | | | | |
|---|---|---|---|---|
| JP | 2005314414 A | * | 11/2005 | C07F 15/00 |
| JP | 2007-42624 | | 2/2007 | |
| JP | 2007-161860 | | 6/2007 | |
| JP | 2007-176917 | | 7/2007 | |
| WO | WO 2006/098460 A1 | | 9/2006 | |
| WO | WO 2007/004729 A1 | | 1/2007 | |

OTHER PUBLICATIONS

Steel, P.J. et al, "Cyclometallated Compounds. V. Double Cyclopalladation of Diphenyl Pyrazines and Related Ligands," Journal of Organometallic Chemistry, vol. 395, 1990, pp. 359-373.

Duan, J.P. et al, "New Iridium Complexes as Highly Efficient Orange-Red Emitters in Organic Light-Emitting Diodes," Adv. Mater., vol. 15, No. 3, Feb. 5, 2003, pp. 224-228.

Zhang, G.L. et al, "Synthesis and Phosphorescence of a New Iridium (III) Pyrazine Complex," Acta. Phys. -Chim. Sin. (Wuli Huaxue Xuebao), vol. 19, No. 10, 2003, pp. 889-891 (Abstract).

Zhang, G.L. et al, "Synthesis and Luminescence Property of a New Yellow Phosphorescent Iridium (III) Pyrazine Complex," Chemical Journal of Chinese Universities, vol. 25, No. 3, Mar. 2004, pp. 397-400 (with English translation).

Steel, P.J. et al, "Cyclometallated Compounds. V. Double Cyclopalladation of Diphenyl Pyrazines and Related Ligands," Journal of Organometallic Chemistry, vol. 395, No. 3, 1990, pp. 359-373.

Zhang, G.L. et al, "Synthesis and Luminescence Property of a New Yellow Phosphorescent Iridium (III) Pyrazine Complex," Chemical Journal of Chinese Universities, vol. 25, No. 3, Mar. 2004, pp. 397-400 (with English Abstract and Translation).

Zhang, G.L. et al, "Synthesis and Phosphorescence of a New Iridium (III) Pyrazine Complex," Acta. Phys. -Chim. Sin. (Wuli Huaxue Xuebao), vol. 19, No. 10, 2003, pp. 889-891 (with full English translation).

Zhang, G.L. et al, "Synthesis and Luminescence Property of a New Yellow Phosphorescent Iridium (III) Pyrazine Complex," Chemical Journal of Chinese Universities, vol. 25, No. 3, Mar. 2004, pp. 397-400 (with full English translation).

* cited by examiner

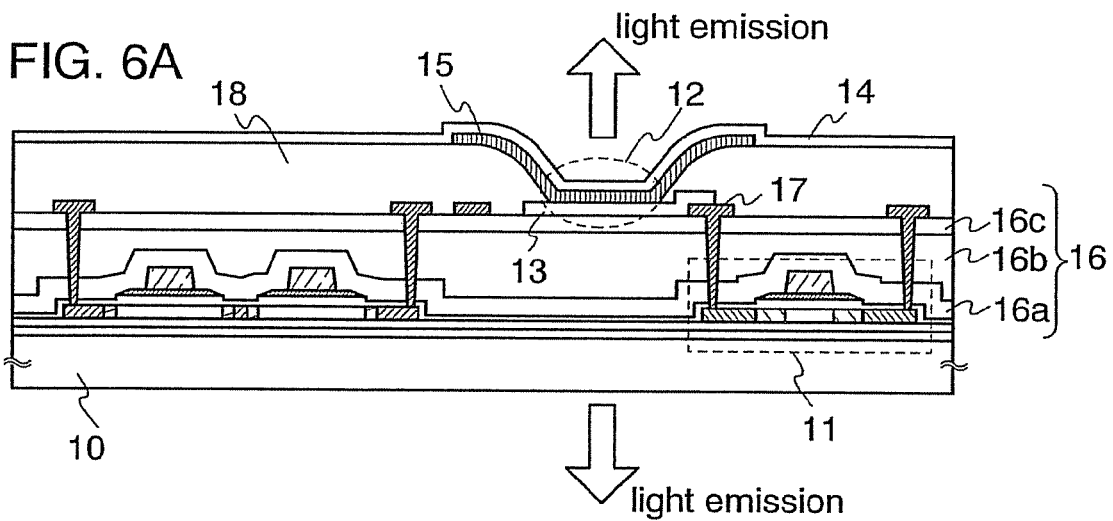
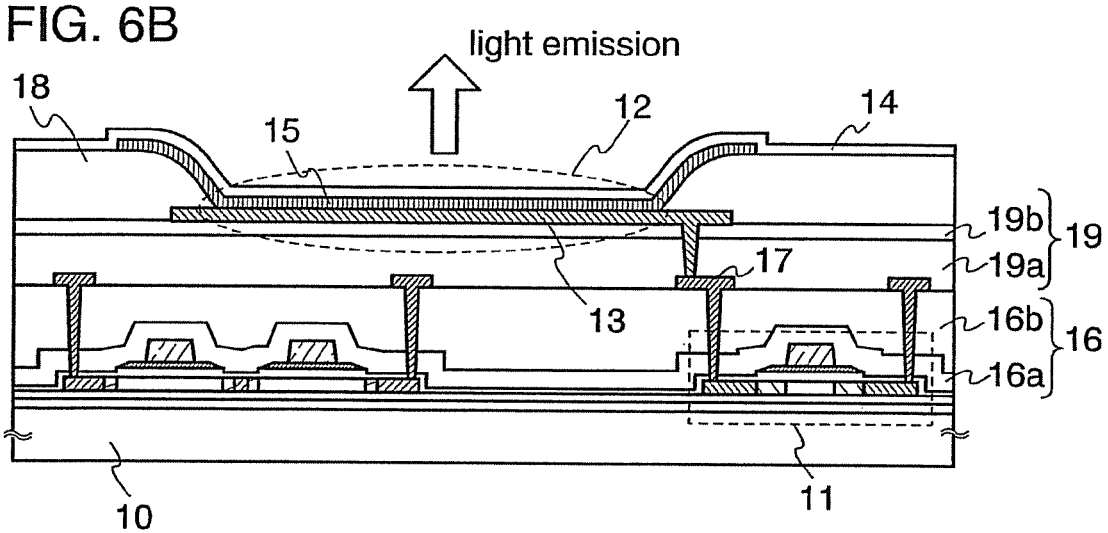
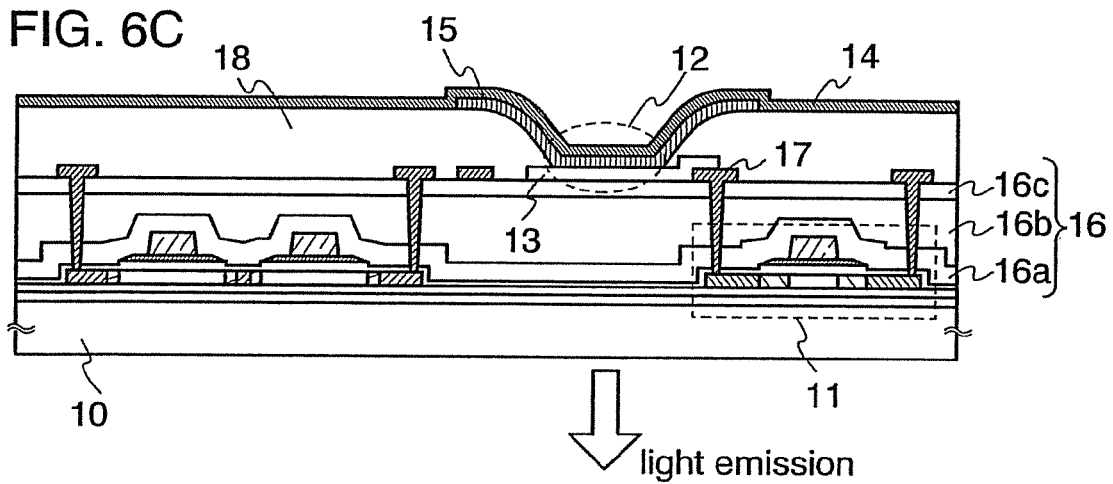

LIGHT EMITTING DEVICE AND ELECTRONIC APPLIANCE USING THE SAME

This application is a continuation of U.S. application Ser. No. 11/431,648, filed on May 9, 2006 now U.S. Pat. No. 7,960,038.

BACKGROUND OF THE INVENTION

1. Field of the Invention

The present invention relates to a light emitting element that can obtain light emission from a triplet excited state, and a light emitting device and an electronic appliance using the light emitting element.

2. Description of the Related Art

A light emitting element that emits light when excitons generated by a recombination of holes and electrons flowing between a pair of electrodes return to a ground state, can be utilized as a pixel or a light source. For this reason, its development has been advanced further in recent years. In the development of the light emitting element, an improvement in light emission efficiency is important in reducing power consumption for a light emitting device using the light emitting element as a pixel, or a lighting device using the light emitting element as a light source.

Before now, it has been known that light emission efficiency can be improved by using a phosphorescent substance. For example, in Patent Document 1: Published Japanese translation of PCT International application, No. 2004-515895, a light emitting element is described, which is able to emit light efficiently as a result of providing a mixed layer doped with a phosphorescent substance between an anode and a cathode, and suppressing holes from moving towards an anode side.

It can be considered that it is effective to efficiently emit light by technology such as that of Patent Document 1. However, in order to implement Patent Document 1, it is necessary to evaporate three kinds of materials simultaneously with good precision, and it can be considered that a case where a manufacturing margin is low could occur. Consequently, development of a new technology for obtaining a light emitting element that emits light with high efficiency is demanded.

SUMMARY OF THE INVENTION

An object of the present invention is to provide a light emitting element that is capable of making an organometallic complex to emit light efficiently. Also, an object of the present invention is to provide a light emitting device that can be operated efficiently.

In implementing the present invention, an organometallic complex represented in the following General Formula (1) is used.

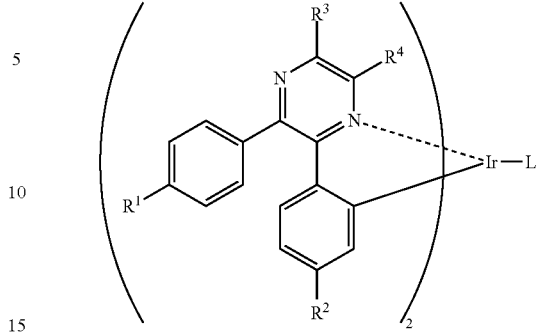

(1)

In the General Formula (1), $R^1$ and $R^2$ each represent an electron-withdrawing group. Also, $R^3$ and $R^4$ each represent any of hydrogen or an alkyl group having 1 to 4 carbon atoms. Further, L represents a monoanionic ligand such as a monoanionic ligand having a beta-diketone structure, a monoanionic bidentate chelating ligand having a carboxyl group, or a monoanionic bidentate chelating ligand having a phenolic hydroxyl group. Here, as the electron-withdrawing group, any group selected from the following is preferable: a halogen group, a —$CF_3$ group, a cyano group, and an alkoxycarbonyl group. Also, for the alkyl group having 1 to 4 carbon atoms, any group selected from the following is preferable: a methyl group, an ethyl group, an isopropyl group, and a sec-butyl group. Further, specifically, L is preferably any monoanionic ligand selected from ligands represented in the following Structural Formulas (1) to (7).

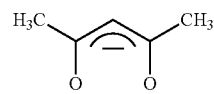

(1)

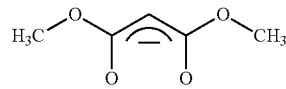

(2)

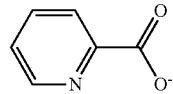

(3)

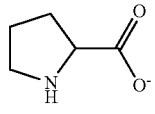

(4)

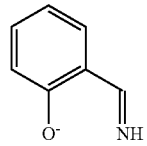

(5)

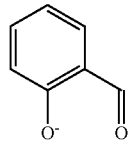

(6)

-continued

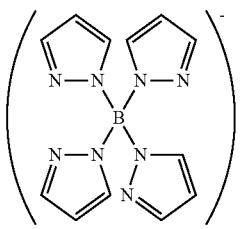

(7)

The present invention is described in detail below.

One aspect of the present invention is a light emitting element including a first electrode and a second electrode, between which a light emitting layer, a hole transporting layer provided in contact with the light emitting layer, an electron transporting layer provided in contact with the light emitting layer, and a mixed layer provided between the electron transporting layer and the second electrode. A hole transporting substance included in the hole transporting layer is not particularly limited; however, it is preferable that the hole transporting substance has a hole mobility of $1 \times 10^{-6}$ cm$^2$/Vs or higher, and more preferably, the hole transporting substance has larger excitation energy than that of a host used in a light emitting layer 113, and has a hole mobility of $1 \times 10^{-6}$ cm$^2$/Vs or higher. Also, a first electron transporting substance included in the electron transporting layer is not particularly limited; however, it is preferable that the electron transporting substance has an electron mobility of $1 \times 10^{-6}$ cm$^2$/Vs or higher, and more preferably, the electron transporting substance has larger excitation energy than that of the host used in the light emitting layer 113, and has a hole mobility of $1 \times 10^{-6}$ cm$^2$/Vs or higher. Also, the mixed layer includes a second electron transporting substance, and a substance showing an electron donating property with respect to the second electron transporting substance. The light emitting layer includes the organometallic complex represented in the General Formula (1) and the host. Note that the first electron transporting substance and the second electron transporting substance can be different from each other or the same. Also, the second electron transporting substance can have smaller excitation energy than that of the host. Further, between the first electrode and the second electrode, a hole injecting layer, or a second mixed layer including a second hole transporting substance and a substance showing an electron accepting property with respect to the second hole transporting substance may be provided. Note that the hole transporting substance included in the hole transporting layer and the second hole transporting substance my be different from each other or the same. Also, the second hole transporting substance may have smaller excitation energy than that of the host. By applicating such a structure to the light emitting element, light can be emitted efficiently when voltage is applied so that the potential of the first electrode is higher than that of the second electrode.

One aspect of the present invention is a light emitting device using the light emitting element of the present invention described above as a pixel or a light source.

One aspect of the present invention is an electronic appliance using a light emitting device that uses the light emitting element of the present invention described above as a pixel or a light source, for a display portion.

By implementing the present invention, a light emitting element that emits light efficiently can be obtained. This is because by the present invention, electrons and holes can be injected into a light emitting layer with good balance, and because light can be emitted by effectively utilizing the injected electrons and holes. By implementing the present invention, a light emitting device that operates with good current efficiency can be obtained. This is because by using a light emitting element of the present invention for which external quantum efficiency has been improved, light emission with high luminance can be obtained even with low voltage. By implementing the present invention, an electronic appliance that operates with low power consumption can be obtained. This is because a light emitting device that operates with good current efficiency, by using a light emitting element of the present invention, is used as a display means or a lighting means.

BRIEF DESCRIPTION OF DRAWINGS

In the Accompanying Drawings:

FIGS. 6A to 6C each describe one mode of a cross-section of a light emitting device of the present invention.

DETAILED DESCRIPTION OF THE INVENTION

Embodiment Mode

Although the present invention will be fully described by way of embodiment modes with reference to the accompanying drawings, it is to be understood that various changes and modifications will be apparent to those skilled in the art. Therefore, unless otherwise such changes and modifications depart from the scope of the invention, they should be construed as being included therein. Therefore, the present invention should not be interpreted as being limited to the description of the embodiment modes to be given below.

Embodiment Mode 1

Figure 1:
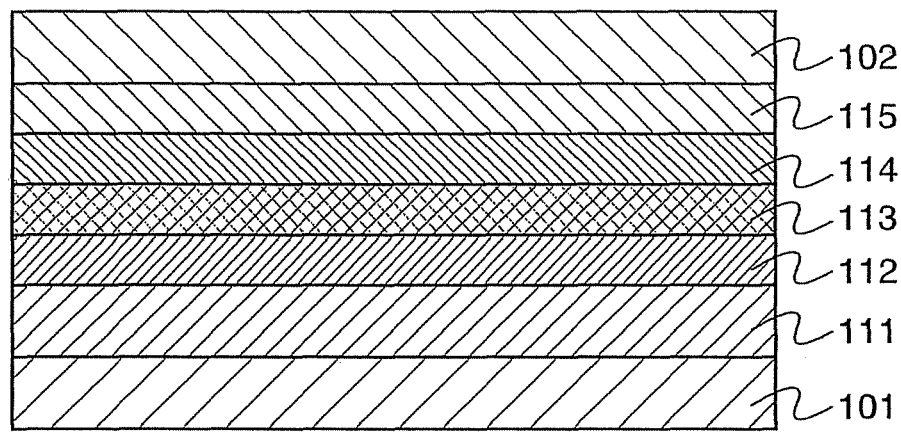
FIG. 1 describes one mode of a light emitting element of the present invention.

One mode of a light emitting element of the present invention is described using FIG. 1.

FIG. 1 shows a light emitting element including the light emitting layer 113 between a first electrode 101 and a second electrode 102. Also, between the light emitting layer 113 and the second electrode 102, a first mixed layer 115 including an electron transporting substance and a substance showing an electron donating property with respect to the electron transporting substance is provided. Further, on a first electrode 101 side than the light emitting layer 113, a hole transporting layer 112 is provided to be in contact with the light emitting layer 113, and on a second electrode 102 side than the light emitting layer 113, an electron transporting layer 114 is provided to be in contact with the light emitting layer 113. Note that the light emitting element in FIG. 1 has a hole injecting layer 111 provided between the first electrode 101 and the hole transporting layer 112. In the light emitting layer 113, a light emitting substance is included. In such a light emitting element, when voltage is applied to the first electrode 101 and the second electrode 102 so that the potential of the first electrode 101 is higher than the potential of the second electrode 102, holes are injected from the first electrode 101 side to the light emitting layer 113, and electrons are injected from the second electrode 102 side to the light emitting layer 113. Subsequently, holes and electrons injected to the light emitting layer 113 are recombined. A light emitting substance is included in the light emitting layer 113, and the light emitting substance comes to an excited state by excitation energy generated by the recombination. The light emitting substance in the excited state emits light upon returning to a ground state.

The first electrode 101, the second electrode 102, and each of the layers provided therebetween are described in detail below.

A substance forming the first electrode 101 is not particularly limited; however, a substance having a high work function, such as indium tin oxide, indium tin oxide containing silicon oxide, indium oxide containing 2 to 20% zinc oxide, gold (Au), platinum (Pt), nickel (Ni), tungsten (W), chromium (Cr), molybdenum (Mo), iron (Fe), cobalt (Co), copper (Cu), palladium (Pd), or tantalum nitride is preferably used. However, in a case of providing a layer having a function of generating holes instead of the hole injecting layer 111, the first electrode 101 can be formed using a substance having a low work function such as aluminum or magnesium.

As a substance forming the second electrode 102, besides a substance having a low work function such as aluminum or magnesium, a substance having a high work function, such as indium tin oxide, indium tin oxide containing silicon oxide, indium oxide containing 2 to 20% zinc oxide, gold (Au), platinum (Pt), nickel (Ni), tungsten (W), chromium (Cr), molybdenum (Mo), iron (Fe), cobalt (Co), copper (Cu), palladium (Pd), or tantalum nitride, can be used.

Note that the first electrode 101 and the second electrode 102 are preferably formed so that one or both of the electrodes are capable of transmitting light that is emitted.

The hole injecting layer 111 is a layer having a function of aiding an injection of holes from the first electrode 101 to the hole transporting layer 112. By providing the hole injecting layer 111, a difference in ionization potential between the first electrode 101 and the hole transporting layer 112 is relieved and holes are easily injected. The hole injecting layer 111 is preferably formed by using a substance with an ionization potential that is smaller than that of a substance forming the hole transporting layer 112 and larger than that of a substance forming the first electrode 101, or a substance that has a gradient of an energy band of which the level rises on the hole transporting layer 112 side when the hole injecting layer 111 is provided as a thin film of 1 to 2 nm between the hole transporting layer 112 and the first electrode 101. As specific examples of substances that can be used to form the hole injecting layer 111, low molecular compounds such as phthalocyanine (abbreviated as $H_2Pc$), copper phthalocyanine (abbreviated as CuPC), and 4,4'-bis{N[4-(N,N-di-m-tolylamino)phenyl]-N-phenylamino}biphenyl (abbreviated as DNTPD); and high molecular compounds such as a poly (ethylenedioxythiophene)/poly(styrenesulfonic acid) solution (PEDOT/PSS) can be given. In other words, the hole injecting layer 111 can be formed by selecting a substance that makes an ionization potential of the hole injecting layer 111 smaller than that of the hole transporting layer 112.

The hole transporting layer 112 is a layer having a function of transporting holes, and in the light emitting element of this embodiment mode, the hole transporting layer 112 has a function of transporting holes from the hole injecting layer 111 to the light emitting layer 113. Also, in a case where the hole transporting layer 112 is provided to be in contact with the light emitting layer 113 such as in this embodiment mode, the hole transporting layer 112 also has a function of preventing excitation energy generated in the light emitting layer 113 from translating to another layer from the light emitting layer 113. A hole transporting substance used to form the hole transporting layer 112 is not particularly limited; however, it is preferable to use a hole transporting substance having a hole mobility of $1 \times 10^{-6}$ cm$^2$/Vs or higher, and more preferable to use a hole transporting substance having larger excitation energy than that of the host used in the light emitting layer 113, and having a hole mobility of $1 \times 10^{-6}$ cm$^2$/Vs or higher. By using a hole transporting material having a hole mobility of $1 \times 10^{-6}$ cm$^2$/Vs or higher, an increase in driving voltage due to hole mobility can be suppressed. Further, by using the hole transporting substance having larger excitation energy than that of the host and having a hole mobility of $1 \times 10^{-6}$ cm$^2$/Vs or higher, excitation energy can be prevented from translating from the light emitting layer 113 to the hole transporting layer 112, and a decrease in light emission efficiency due to a translation of excitation energy can be reduced. Here, the hole transporting substance refers to a substance having a higher hole mobility than electron mobility, and preferably, a substance for which a value of a ratio of hole mobility to electron mobility (=hole mobility/electron mobility) is larger than 100. As specific examples of the hole transporting substance, 4,4'-bis[N-(1-naphthyl)-N-phenylamino]biphenyl (abbreviated as NPB), 4,4'-bis[N-(3-methylphenyl)-N-phenylamino]biphenyl (abbreviated as TPD), 1,3,5-tris[N,N-di(m-tolyl)amino]benzene (abbreviated as m-MTDAB), 4,4',4"-tris(N-carbazolyl)triphenylamine (abbreviated as TCTA), and the like are given. Among these hole transporting substances, one having larger excitation energy than that of a substance used as the host may be appropriately selected and used. Also, a thickness of the hole transporting layer 112 is not particularly limited; however, 5 to 30 nm is preferable. By having such thickness, a translation of excitation energy from the hole transporting layer 112 to another layer (in this embodiment mode, the hole injecting layer 111, or if a layer is further provided between the hole transporting layer 112 and the hole injecting layer 111, then that layer) can be suppressed, as well as an increase in driving voltage due to a thickness of the hole transporting layer 112 can be suppressed. By providing the hole transporting layer 112 as in the above, a distance is created between the first electrode 101 and the light emitting layer 113, and quenching of emitted light due to a metal included in the first electrode 101 can be prevented. Also, since a translation of excitation energy from the light emitting layer 113 to another layer can be prevented, light can be emitted with good quantum efficiency.

The light emitting layer 113 includes a light emitting substance (also called a "guest"), as previously mentioned. More specifically, the light emitting substance is included in the light emitting layer 113 in a dispersed state. Further, in the light emitting layer 113, along with the light emitting substance, a substance having a wider energy gap of a triplet excitation state than that of the light emitting substance is included (energy gap refers to an energy gap between a LUMO level and a HOMO level). Such substance having a wider energy gap than the light emitting substance is included in the light emitting layer 113 as a main component, and at a higher concentration than the light emitting substance of the light emitting layer 113, and is called a host. The host has a function of aiding light emission of the light emitting substance. In the light emitting element of this embodiment mode, the organometallic complex represented in General Formula (1) is included as the light emitting substance. By using the organometallic complex represented in General Formula (1), a recombination efficiency of holes and electrons can be improved. Also, non-emitting transition due to excitation life span and the like in a triplet excited state is not easily increased, and excitation and light emission can be repeated efficiently.

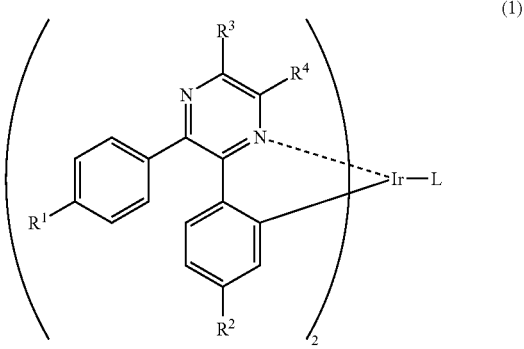

(1)

In General Formula (1), $R^1$ and $R^2$ each represent an electron-withdrawing group. Also, $R^3$ and $R^4$ each represent hydrogen or an alkyl group having 1 to 4 carbon atom. Further, L represents any of a monoanionic ligand having a beta-diketone structure, a monoanionic bidentate chelating ligand having a carboxyl group, or a monoanionic bidentate chelating ligand having a phenolic hydroxyl group. Here, as the electron-withdrawing group, any group selected from the following is preferable: a halogen group, a —$CF_3$ group, a cyano group, and an alkoxycarbonyl group. Also, for the alkyl group having 1 to 4 carbon atoms, any group selected from the following is preferable: a methyl group, an ethyl group, an isopropyl group, and a sec-butyl group. Further, specifically, L is preferably any ligand selected from ligands represented in the following Structural Formulas (1) to (7).

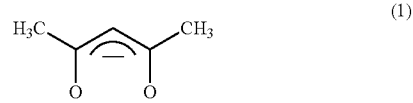

(1)

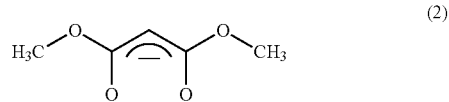

(2)

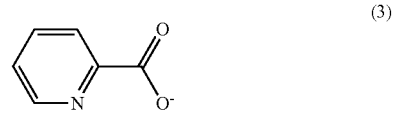

(3)

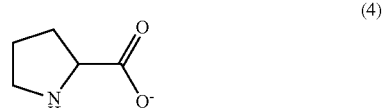

(4)

(5)

(6)

(7)

Also, it is particularly preferable to use organometallic complexes represented in Structural Formulas (8) to (31), which are specific examples of the organometallic complex represented in General Formula (1).

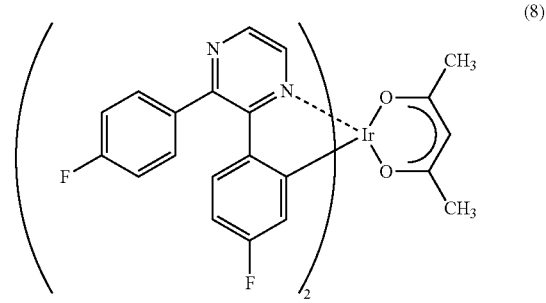

(8)

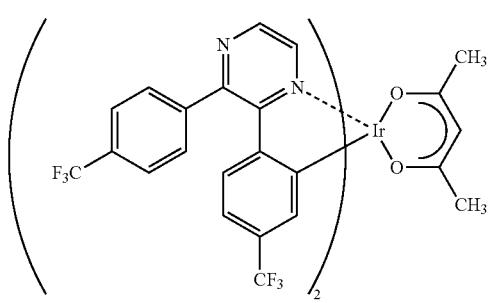
(9)
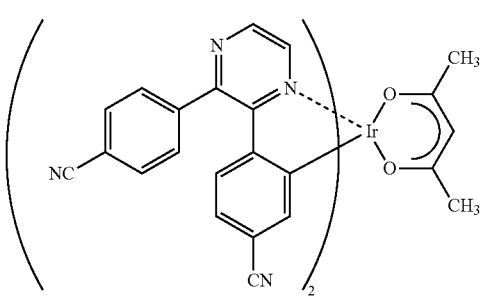
(10)
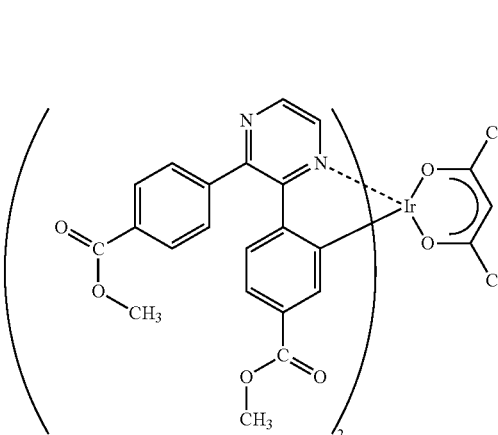
(11)
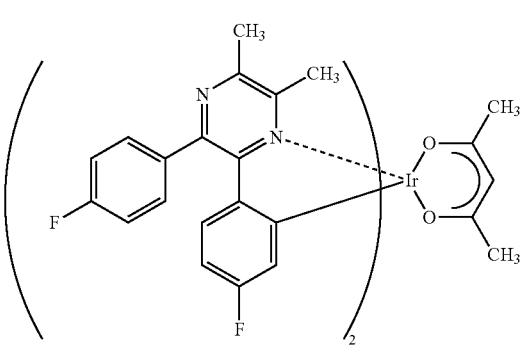
(12)
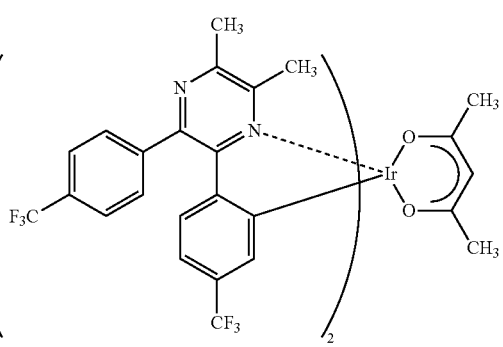
(13)
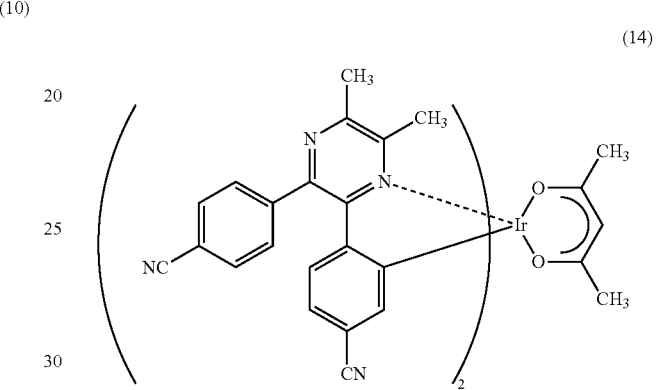
(14)
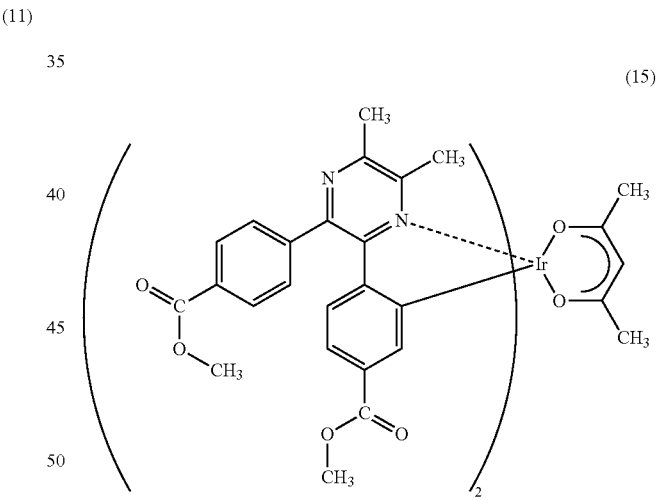
(15)
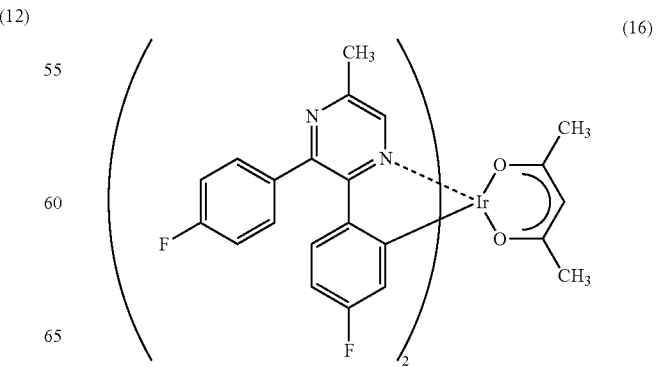
(16)

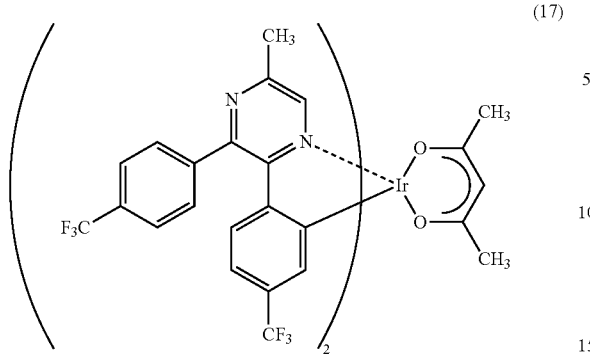
(17)
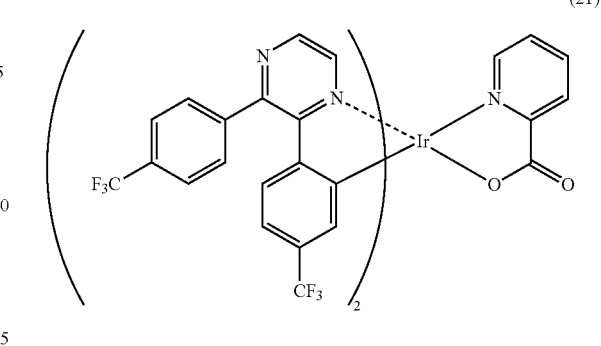
(21)
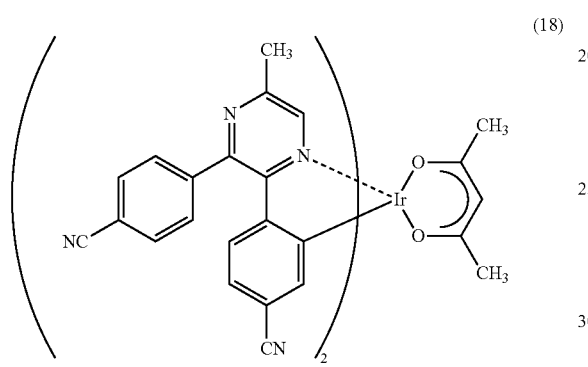
(18)
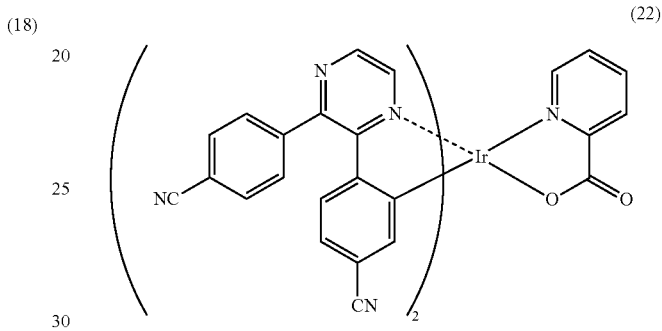
(22)
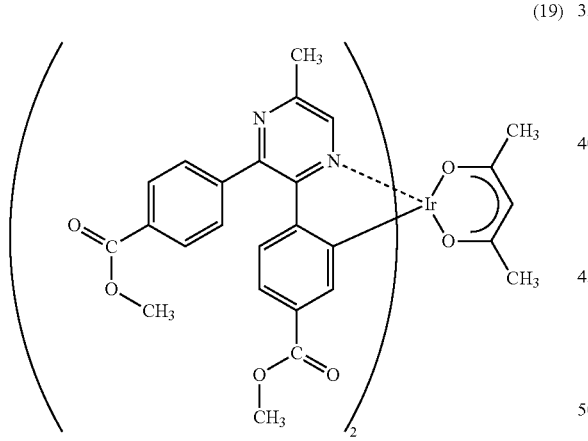
(19)
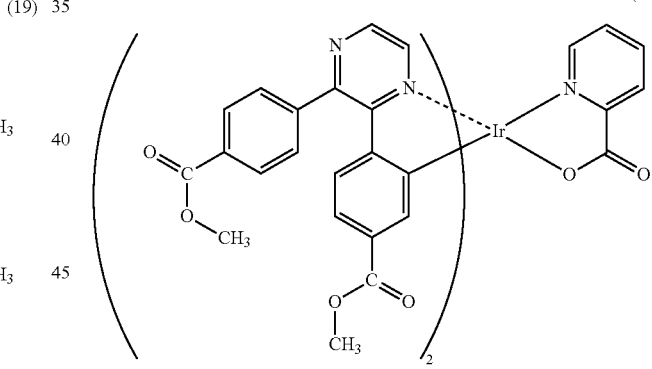
(23)
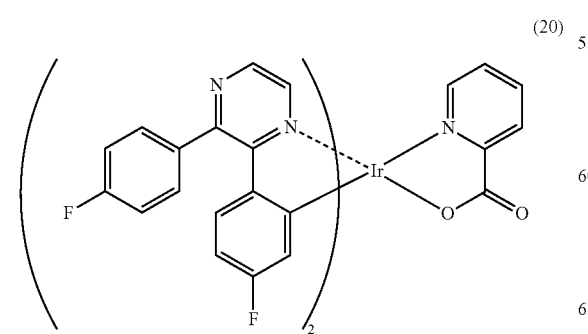
(20)
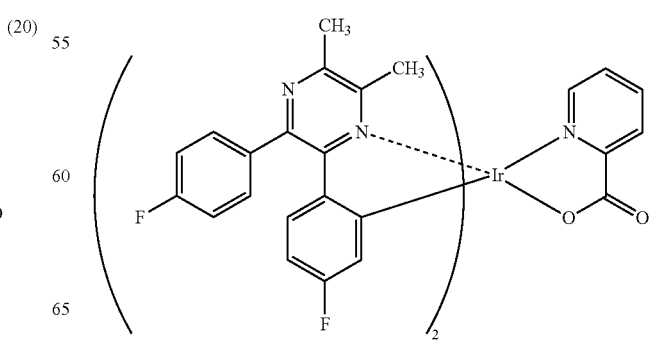
(24)

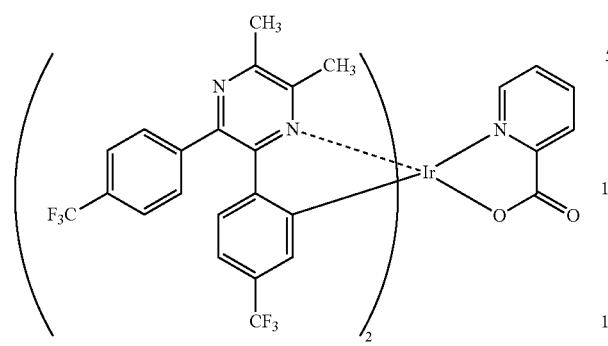

(25)

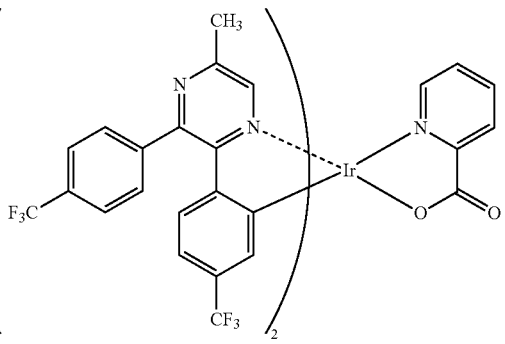

(29)

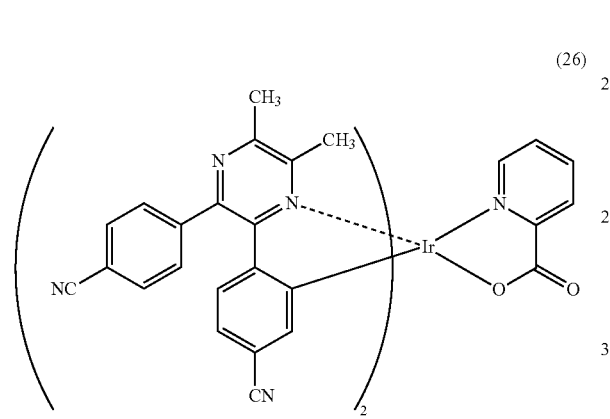

(26)

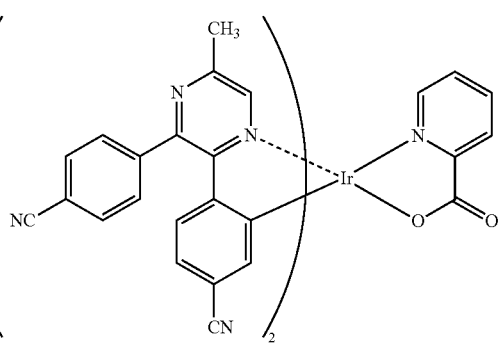

(30)

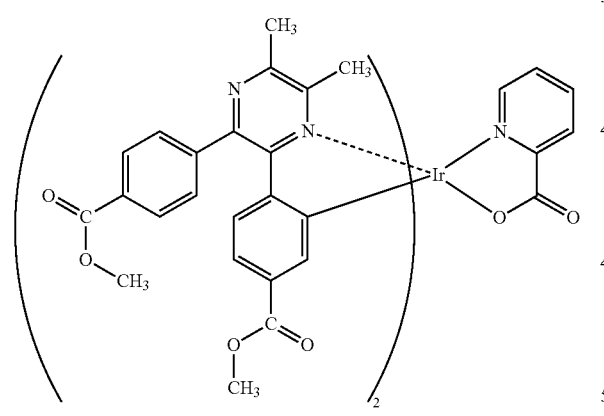

(27)

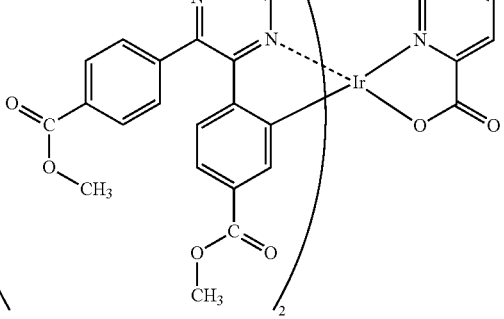

(31)

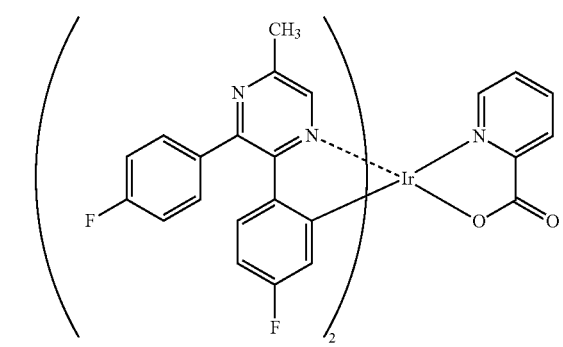

(28)

Also, as the host, a carbazole derivative such as 4,4'-bis(N-carbazolyl)biphenyl (abbreviated as CBP), or 4,4',4''-tris(N-carbazolyl)triphenylamine (abbreviated as TCTA); a compound having an arylamine skeleton such as 4,4'-bis[N-(1-naphthyl)-N-phenylamino]biphenyl (abbreviated as NPB); a metal complex such as bis[2-(2-hydroxyphenyl)pyridinato] zinc (abbreviated as Znpp$_2$) or bis[2-(2-hydroxyphenyl)benzoxazolato]zinc (abbreviated as ZnBOX); or the like is preferably used.

The electron transporting layer 114 is a layer having a function of transporting electrons, and in the light emitting element of this embodiment mode, the electron transporting layer 114 has a function of transporting electrons from the first mixed layer 115 to the light emitting layer 113. Also, in a case where the electron transporting layer 114 is provided to be in contact with the light emitting layer 113 as in this embodiment mode, the electron transporting layer 114 also has a function of preventing excitation energy generated in the light emitting layer 113 from translating to another layer from the light emitting layer 113. An electron transporting substance used to form the electron transporting layer 114 is not particularly limited; however, it is preferable to use an electron transporting substance having an electron mobility of $1\times10^{-6}$ cm$^2$/Vs or higher, and more preferable to use an electron transporting substance having larger excitation energy than that of the host used in the light emitting layer 113, and having an electron mobility of $1\times10^{-6}$ cm$^2$/Vs or higher. By using an electron transporting material having an electron mobility of $1\times10^{-6}$ cm$^2$/Vs or higher, an increase in driving voltage due to electron mobility can be suppressed. Further, by using the electron transporting substance having larger excitation energy than that of the host and having an electron mobility of $1\times10^{-6}$ cm$^2$/Vs or higher, excitation energy can be prevented from translating from the light emitting layer 113 to the electron transporting layer 114, and a decrease in light emission efficiency due to a translation of excitation energy can be reduced. Here, the electron transporting substance refers to a substance having a higher electron mobility than hole mobility, and preferably, a substance of which a value of a ratio of electron mobility to hole mobility (=electron mobility/hole mobility) is larger than 100. As specific examples of the electron transporting substance, bathocuproin (abbreviated as BCP); 3-(4-tert-butylphenyl)-4-phenyl-5-(4-biphenylyl)-1,2,4-triazole (abbreviated as TAZ); bis[2-(2-hydroxyphenyl)benzoxazolato]zinc (abbreviated as Zn(BOX)$_2$), 1,3-bis[5-(p-tert-butylphenyl)-1,3,4-oxadiazole-2-yl]benzene (abbreviated as OXD-7); 3-(4-tert-butylphenyl)-4-(4-ethylphenyl)-5-(4-biphenylyl)-1,2,4-triazole (abbreviated as p-EtTAZ); bathophenanthroline (abbreviated as BPhen); and the like is given. Among these electron transporting substances, one having larger excitation energy than that of the substance used as the host may be appropriately selected and used. Also, a thickness of the electron transporting layer 114 is not particularly limited; however, 5 to 30 nm is preferable. By having such thickness, a translation of excitation energy from the electron transporting layer 114 to another layer (in this embodiment mode, the first mixed layer 115, or if a layer is provided between the electron transporting layer 114 and the first mixed layer 115, then that layer) can be suppressed, as well as an increase in driving voltage due to a thickness of the electron transporting layer 114 can be suppressed. By providing the electron transporting layer 114 as in the above, a distance is created between the first mixed layer 115 that is described below and the light emitting layer 113, and quenching of emitted light due to a metal included in the first mixed layer 115 can be prevented. Also, since a translation of excitation energy from the light emitting layer 113 to another layer can be prevented, light can be emitted with good quantum efficiency.

Each of the hole transporting layer 112, the light emitting layer 113, and the electron transporting layer 114 is/has been described above. It is preferable that the hole transporting substance used to form the hole transporting layer 112, the host, and the electron transporting substance used to form the electron transporting layer 114 satisfy a relationship such as those in (i) and (ii) described below.

(i) an absolute value of a difference between an ionization potential of the hole transporting substance used to form the hole transporting layer 112 and an ionization potential of the host is 0.4 eV or lower;

(ii) an absolute value of a difference between an electron affinity of the electron transporting substance used to form the electron transporting layer 114 and an electron affinity of the host is 0.5 eV or lower.

By satisfying these relationships, hole injection from the hole transporting layer 112 to the light emitting layer 113 and electron injection from the electron transporting layer 114 to the light emitting layer 113 become easy, and as a result, current efficiency can be heightened further.

Here, specific examples (1) to (3) of preferable combinations of the hole transporting substance used to form the hole transporting layer 112, the host, and the electron transporting substance used to form the electron transporting layer 114, are shown in Table 1.

TABLE 1

| | Hole transporting substance | Host | Electron transporting substance |
|---|---|---|---|
| (1) | TCTA | CBP | TAZ |
| (2) | TCTA | CBP | BCP |
| (3) | NPB | TCTA | BCP |

Ionization potentials and electron affinities of substances in Table 1 are shown in Table 2. The ionization potentials (Ip) in Table 2 are values based on measurement by a photoelectron spectrometer (AC-2, manufactured by Riken Keiki Co., Ltd.). Also, the electron affinities (Ea) in Table 2 are calculated by finding a value of an energy gap (ΔE) for each of the substances based on an absorption spectrum of each of the substances, and then subtracting the values of the energy gaps from the values of the ionization potentials obtained from the measurement. When the value of the energy gap is to be found based on the absorption spectrum, a conversion is made with 1.24 μm=1 eV. Note that Ip, Ea, and ΔEa for substances not shown in Table 1 are also shown in Table 2 for reference.

TABLE 2

| | Ip (eV) | Ea (eV) | ΔE (eV) |
|---|---|---|---|
| TCTA | 5.7 | 2.3 | 3.4 |
| CBP | 6.0 | 2.5 | 3.5 |
| TAZ | 5.5 | 2.0 | 3.5 |
| BCP | 6.0 | 2.4 | 3.6 |
| NPB | 5.4 | 2.3 | 3.1 |
| TPD | 5.3 | 2.2 | 3.1 |
| m-MTDAB | 5.1 | 1.9 | 3.2 |
| OXD-7 | 5.7 | 2.0 | 3.7 |

Note that among the combinations shown in Table 1, the most preferable is a combination shown in (1). By combining the substances as in (1), a light emitting element such as a light emitting element described in Embodiment 1, for which external quantum efficiency exceeds 20%, can be manufactured.

The first mixed layer 115 is a layer including an electron transporting substance and a substance showing an electron donating property with respect to the electron transporting substance. For the electron transporting substance included in the first mixed layer 115, it is not necessary to always select a substance having larger excitation energy than that of the host. As specific examples of electron transporting substances that can be used for forming the first mixed layer 115, beside the electron transporting substances listed in a description of the electron transporting layer 114, metal complexes such as tris(8-quinolinolato)aluminum (abbreviated as Alq$_3$), tris(4-methyl-8-quinolinolato)aluminum (abbreviated as Almq$_3$), bis(10-hydroxybenzo[h]-quinolinato)beryllium (abbreviated as BeBq$_2$), bis(2-methyl-8-quinolinolato)-4-phenylphenolato-aluminum (abbreviated as BAlq), bis[2-(2-hydroxyphenyl)benzothiazolato]zinc (abbreviated as Zn(BTZ)$_2$); and electron transporting substances such as 2-(4-biphenylyl)-5-(4-tert-butylphenyl)-1,3,4-oxadiazole (abbreviated as PBD), and 4-bis(5-methylbenzoxazol-2-yl)stilbene (abbreviated as BzOs); can be used. Also, for the substance showing an electron donating property, a metal such as an alkali metal (group I of the periodic table), such as lithium, sodium, or cesium; or an alkaline earth metal (group II of the periodic table), such as magnesium, calcium, strontium, or barium, is preferably used. By providing the first mixed layer 115 as in the above, more electrons can be injected from the second electrode 102 side into the light emitting layer 113.

In a light emitting element having a structure like the above, electrons and holes can be injected into the light emitting layer 113 with good balance. This is because by providing a layer like the first mixed layer 115, that includes an electron transporting substance and a substance showing an electron donating property with respect to the electron transporting substance, more electrons can be injected into the light emitting layer 113, and as a result, an excess of holes with respect to electrons injected into the light emitting layer 113 can be prevented. Also, in a light emitting element having a structure like the above, a rate of electrons and holes that contribute to light emission is high among electrons and holes injected into the light emitting layer 113; in other words, current efficiency is high. This is because by using the organometallic complex represented in General Formula (1) as the light emitting substance, electrons and holes injected into the light emitting layer 113 can be effectively utilized for light emission. More specifically, it is because by using the organometallic complex represented in General Formula (1), as the light emitting substance, electrons and holes can be recombined efficiently; in other words, recombination efficiency can be improved for carriers, as well as repetition of excitation and light emission can be performed efficiently. In this manner, by implementing the present invention, current efficiency improves and as a result, a light emitting element with favorable external quantum efficiency can be obtained.

Note that in the light emitting element described above, a second mixed layer including a hole transporting substance and a substance showing an electron accepting property with respect to the hole transporting substance may be provided instead of the hole injecting layer 111. For the hole transporting substance used to form the second mixed layer, it is not necessary to always select a substance having larger excitation energy than that of the host. To form the second mixed layer, the hole transporting substances listed in a description of the hole transporting layer 112 can be used. Also, as the substance showing an electron accepting property, a metal oxide such as molybdenum oxide, vanadium oxide, ruthenium oxide, or rhenium oxide is preferably used.

Further, in the light emitting element described above, a hole transporting layer that is formed by using a hole transporting substance that is different from the hole transporting substance used to form the hole transporting layer 112, is also acceptable to be provided between the hole transporting layer 112 and the hole injecting layer 111. Also, since the hole transporting layer provided in this manner is not in contact with the light emitting layer 113, it may be formed by using a hole transporting substance with smaller excitation energy than that of the host. Furthermore, between the electron transporting layer 114 and the first mixed layer 115 also, an electron transporting layer that is formed by using an electron transporting substance that is different from the electron transporting substance used to form the electron transporting layer 114, is acceptable to be provided. Also, since the electron transporting layer provided in this manner is not in contact with the light emitting layer 113, it may be formed by using an electron transporting substance with smaller excitation energy than that of the host.

Also, a manufacturing method of the light emitting element described above is not particularly limited, and the light emitting element may be manufactured by appropriately selecting a method such as a sputtering method, an evaporation method, or an ink jet method. In particular, a layer in which a plurality of compounds are mixed, like the light emitting layer 113 and the first mixed layer 115, may be formed using for example a co-evaporation method. Here, the co-evaporation method refers to an evaporation method of vaporizing a raw material from each of a plurality of evaporation sources provided in a single processing chamber, and then accumulating the evaporated compounds so as to be in a mixed state, over an object to be processed. Further, the light emitting element described above may be manufactured in an order of stacking the light emitting layer and the like from the first electrode 101 and then lastly forming the second electrode 102. Alternatively, the light emitting element described above may be manufactured in an order of stacking the light emitting layer and the like from the second electrode 102 and then lastly forming the first electrode 101.

Embodiment Mode 2

A synthesis method of an organometallic complex used in implementing the present invention is described. Note that the synthesis method is not limited to a method disclosed here, and another synthesis method may be applied.

An organometallic complex of the present invention represented in any of Structural Formula (8) to Structural Formula (31) is obtained by synthesis methods such as those represented in Synthesis Scheme (a-1) to Synthesis Scheme (a-3). A ligand having an electron-withdrawing group is synthesized by way of Synthesis Scheme (a-1). Subsequently, the synthesized ligand having an electron-withdrawing group is mixed with iridium (III) chloride hydrochloride hydrate as shown in Synthesis Scheme (a-2), so that it is coordinated with iridium. Further, as shown in Synthesis Scheme (a-3), a monoanionic ligand is coordinated with iridium.

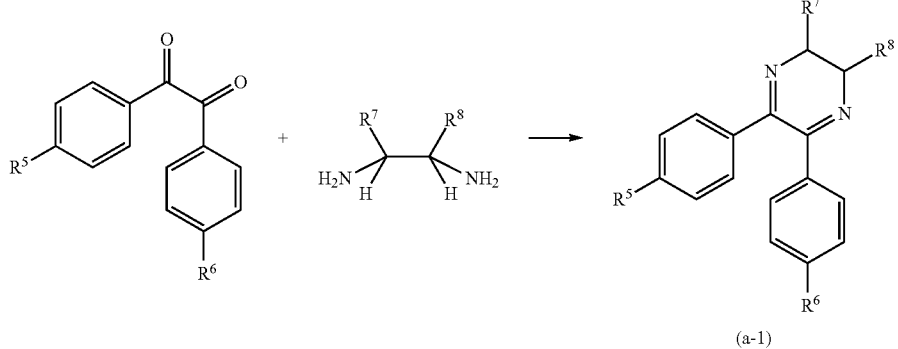

(a-1)

-continued
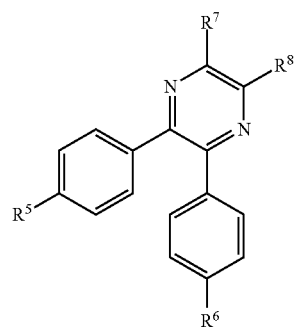
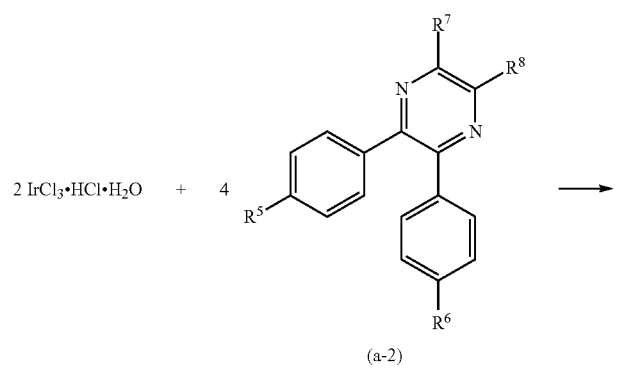
(a-2)
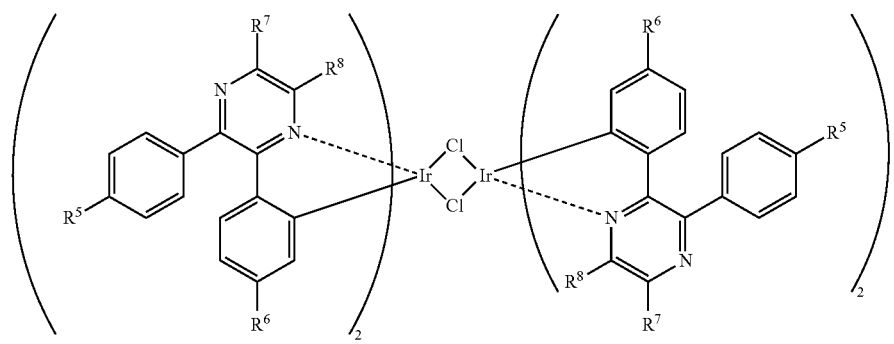
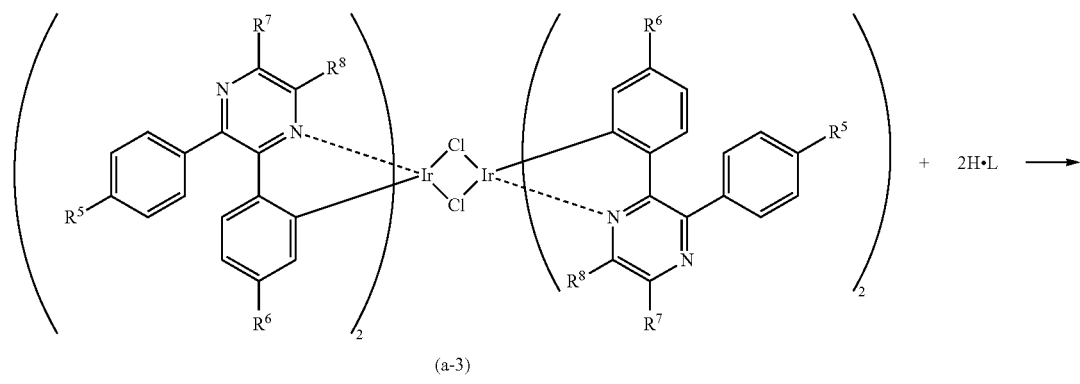
(a-3)

-continued

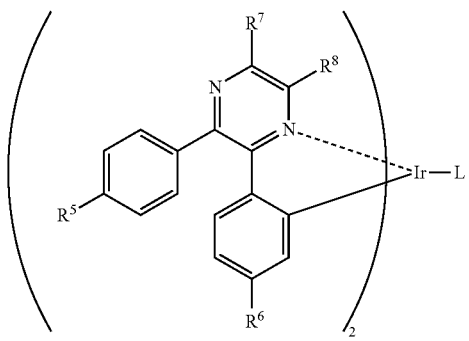

Here, $R^5$ and $R^6$ in Synthesis Scheme (a-1) to Synthesis Scheme (a-3) each represent any of a fluoro group, a —$CF_3$ group, a cyano group, or an alkoxycarbonyl group. Also, $R^7$ and $R^8$ each represent hydrogen or a methyl group. Further, L represents acetylacetone or picoline acid.

Note that a synthesis method for an organometallic complex of the present invention is not limited to those represented in Synthesis Scheme (a-1) to Synthesis Scheme (a-3). For example, as for a ligand obtained in Synthesis Scheme (a-1), a ligand in which both of $R^7$ and $R^8$ are substituted by an alkyl group can be obtained by using 2,3-diphenyl-1,4-dihydropyrazine-5,6-dione in which a para position of a phenyl group is substituted by an electron-withdrawing group as a raw material, and forming a dichlorinated compound in which 5 and 6 positions are chlorinated by using $POCl_3$ and the like, and then coupling the obtained dichlorinated compound and an alkyl metal. In addition, by using salt containing platinum such as tetrachloroplatinate potassium instead of iridium (III) chloride hydrochloride hydrate, an organometallic complex of the present invention containing platinum as a central metal can be obtained. Further, by using a ligand such as dimethyl malonate, salicylaldehyde, salicylideneamine, or tetrapyrazolato boronate instead of acetylacetone or picolinic acid, the organometallic complex of the present invention including a ligand represented by Structural Formulas (2) and (4) to (7) can be obtained.

Embodiment Mode 3

Since a light emitting element of the present invention is capable of efficient light emission, by using the light emitting element described in Embodiment Mode 1 for a pixel, a light emitting device that can carry out a displaying operation with good current efficiency can be obtained.

In this embodiment mode, a circuit structure and a driving method of a light emitting device having a display function is described with reference to FIGS. 2 to 6C.

Figure 2:
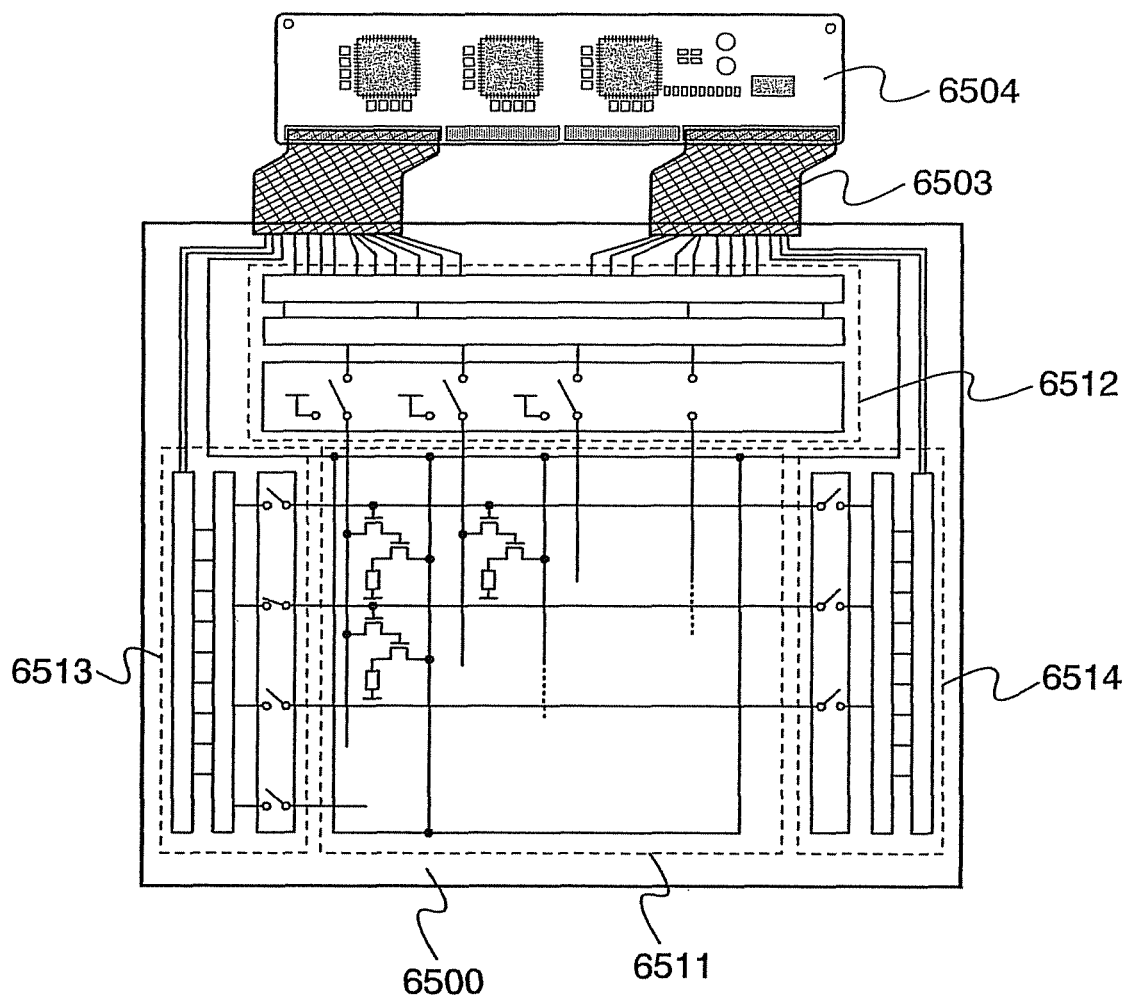
FIG. 2 is a top view describing one mode of a light emitting device of the present invention.

FIG. 2 is a schematic top view of a light emitting device to which the present invention is applied. In FIG. 2, a pixel portion 6511, a source signal line driving circuit 6512, a writing gate signal line driving circuit 6513, and an erasing gate signal line driving circuit 6514 are provided over a substrate 6500. Each of the source signal line driving circuit 6512, the writing gate signal line driving circuit 6513, and the erasing gate signal line driving circuit 6514 is connected to FPCs (flexible printed circuits) 6503 that are external input terminals through a group of wirings. Further, each of the source signal line driving circuit 6512, the writing gate signal line driving circuit 6513, and the erasing gate signal line driving circuit 6514 receives signals such as a video signal, a clock signal, a start signal, and a reset signal from the FPCs 6503. In addition, a printed wiring board (PWB) 6504 is attached to the FPCs 6503. It is not always necessary to provide the driving circuit portion over the same substrate as the pixel portion 6511 as described above. For example, the driving circuit portion may be provided outside the substrate by using a TCP in which an IC chip is mounted over an FPC where a wiring pattern is formed.

In the pixel portion 6511, a plurality of source signal lines extending in columns are arranged in rows. In addition, current-supply lines are arranged in rows, and a plurality of gate signal lines extending in rows are arranged in columns. Further, a plurality of pairs of circuits each including a light emitting element are arranged.

Figure 3:
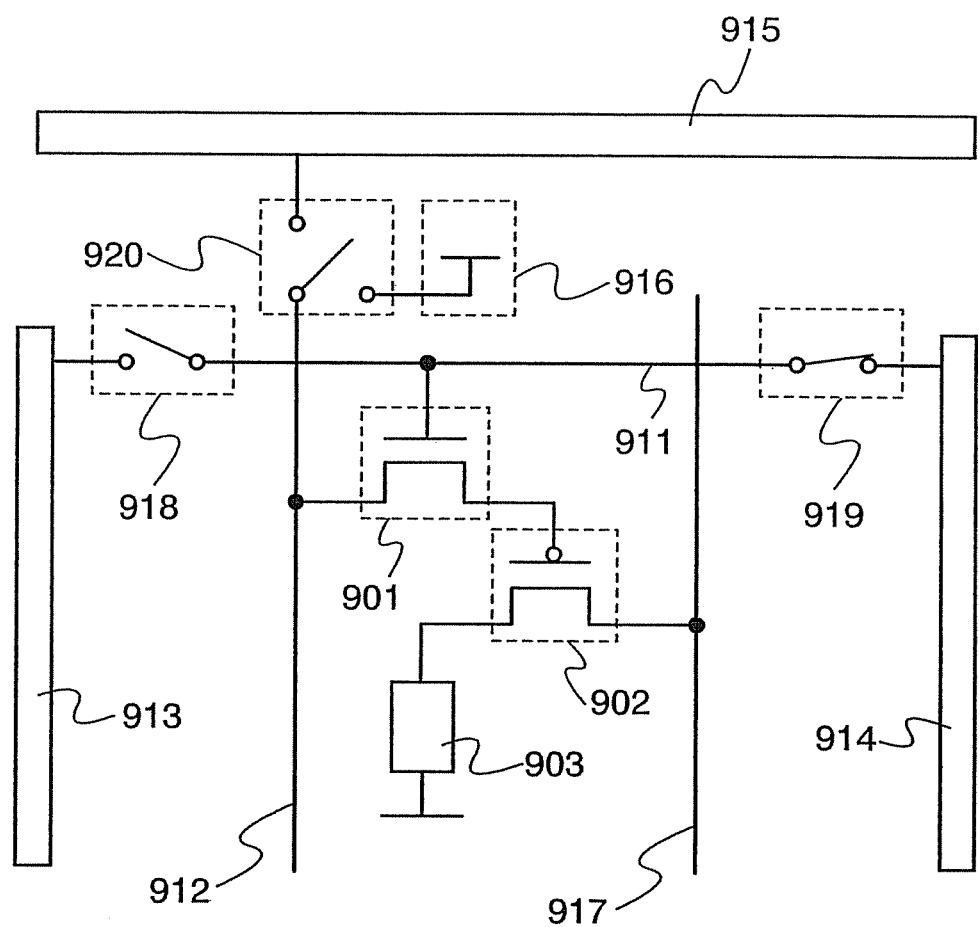
FIG. 3 describes one mode of a circuit for driving a pixel provided for a light emitting device of the present invention.

FIG. 3 shows a circuit for operating one pixel. A circuit shown in FIG. 3 includes a first transistor 901, a second transistor 902, and a light emitting element 903.

Each of the first transistor 901 and the second transistor 902 is a three-terminal element including a gate electrode, a drain region, and a source region, and includes a channel region between the drain region and the source region. Here, since a source region and a drain region are switched with each other in accordance with a structure or operating conditions of a transistor, it is difficult to identify which one is the drain region or the source region. Therefore, in this embodiment mode, regions that serve as a source or a drain are referred to as a first electrode and a second electrode of the transistor, respectively.

A gate signal line 911 and a writing gate signal line driving circuit 913 are provided so as to be electrically connected or unconnected by a switch 918. The gate signal line 911 and an erasing gate signal line driving circuit 914 are provided so as to be electrically connected or unconnected by a switch 919. Further, a source signal line 912 is provided so as to be electrically connected to any of a source signal line driving circuit 915 and a power source 916 by a switch 920. A gate of the first transistor 901 is electrically connected to the gate signal line 911, a first electrode of the first transistor is electrically connected to the source signal line 912, and a second electrode is electrically connected to a gate electrode of the second transistor 902. A first electrode of the second transistor 902 is electrically connected to a current-supply line 917 and a second electrode is electrically connected to one electrode included in the light emitting element 903. It is to be noted that the switch 918 may be included in the writing gate signal line driving circuit 913, the switch 919 may be included in the erasing gate signal line driving circuit 914, and the switch 920 may be included in the source signal line driving circuit 915.

Figure 4:
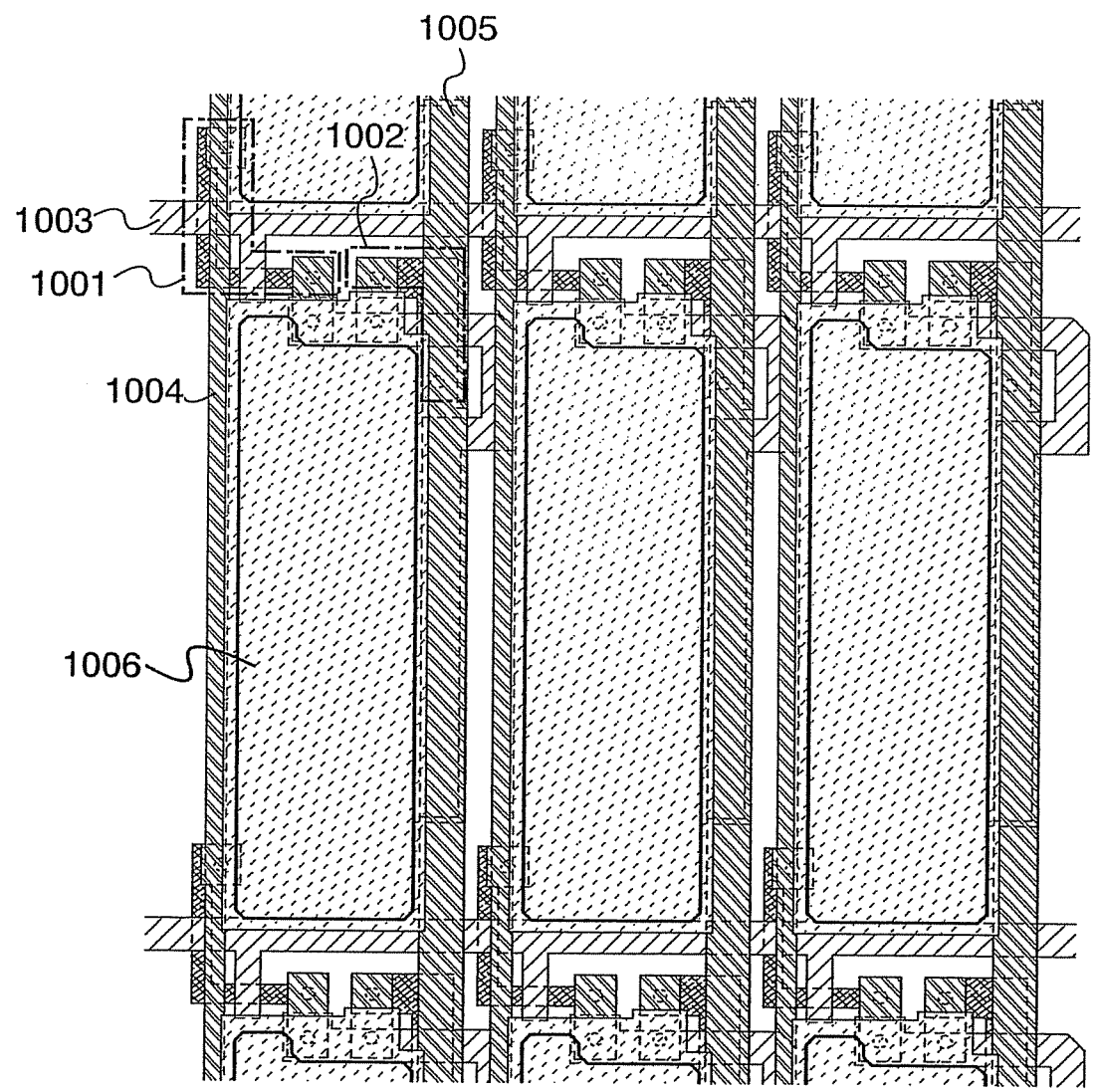
FIG. 4 describes one mode of a pixel portion included in a light emitting device of the present invention.

In addition, arrangement of a transistor, a light emitting element, and the like in a pixel portion is not particularly limited. For example, arrangement shown in a top view of FIG. 4 can be employed. In FIG. 4, a first electrode of a first transistor 1001 is connected to a source signal line 1004 and a second electrode is connected to a gate electrode of a second transistor 1002. Moreover, a first electrode of the second transistor 1002 is connected to a current-supply line 1005 and a second electrode is connected to an electrode 1006 of a light emitting element. A part of a gate signal line 1003 serves as a gate electrode of the first transistor 1001.

Figure 5:
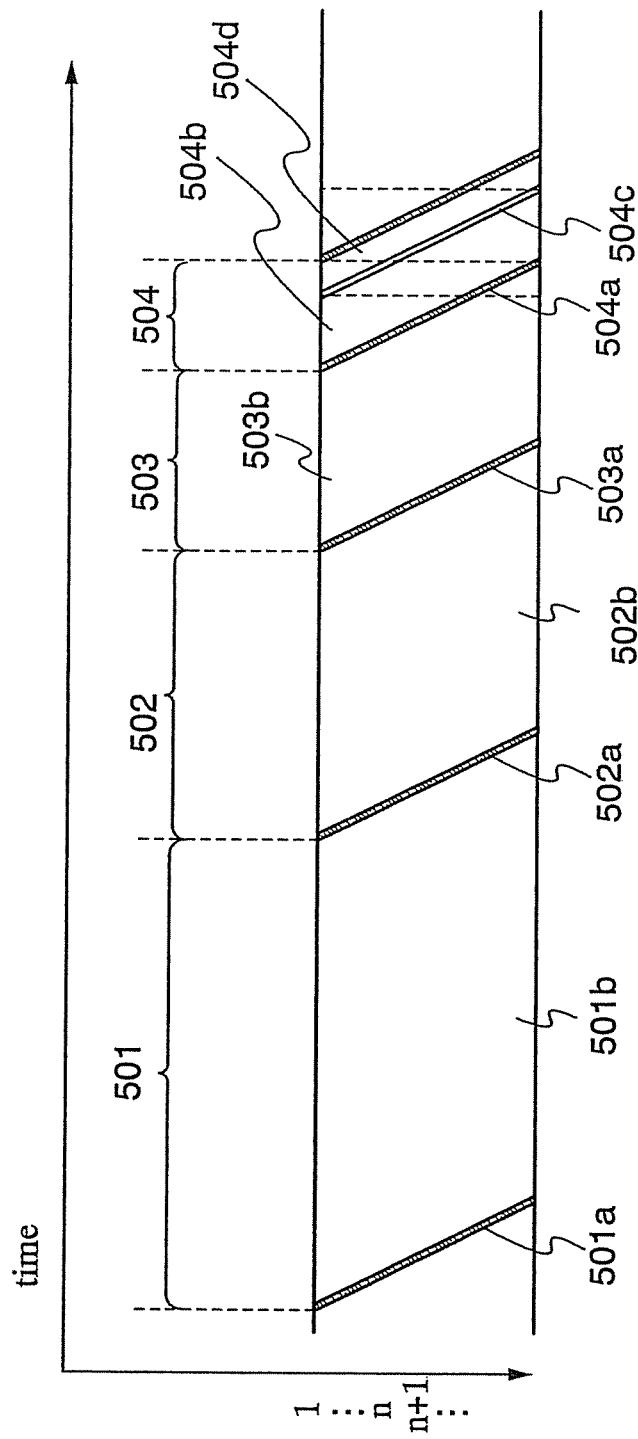
FIG. 5 describes a driving method for driving a pixel included in a light emitting device of the present invention.

Next, a driving method will be explained. FIG. 5 is a diagram illustrating an operation per frame in accordance with passage of time. In FIG. 5, the horizontal direction indicates passage of time, and the vertical direction indicates ordinal numbers of gate signal lines.

When a light emitting device of the present invention is used to display images, a rewrite operation and a display operation for a screen are repeated in a display period. Although the number of rewrites is not particularly limited, it is preferable that the number of rewrites be at least about 60 times per second so as not to make a viewer notice flickers. Here, a period for which a rewrite operation and a display operation are performed for a screen (one frame) is referred to as one frame period.

As shown in FIG. 5, one frame is divided into four sub-frames 501, 502, 503, and 504 including writing periods 501a, 502a, 503a, and 504a and retention periods 501b, 502b, 503b, and 504b, respectively. A light emitting element to which a signal for emitting light is given is made to be in an emitting state. The ratio of the length of the retention period in each sub-frame is, the first sub-frame 501: the second sub-frame 502: the third sub-frame 503: the fourth sub-frame $504 = 2^3:2^2:2^1:2^0 = 8:4:2:1$. This makes 4-bit gradation possible. However, the number of bits and the number of gradations are not limited to the ones described here. For example, eight sub-frames may be provided so as to perform 8-bit gradation.

An operation in one frame will be explained. First, in the sub-frame 501, writing operations are sequentially performed for a first row to a last row. Consequently, the start time of writing period is different depending on the rows. Rows for which the writing period 501a is completed are sequentially moved into the retention period 501b. In a retention period, a light emitting element to which a signal for emitting light is given is made to be in an emitting state. In addition, rows for which the retention period 501b is completed are sequentially moved into the next sub-frame 502, and writing operations are sequentially performed for the first row to the last row as in the case of the sub-frame 501. Such operations as described above are repeated and complete up to the retention period 504b of the sub-frame 504. When the operation in the sub-frame 504 is completed, the rows are moved into the next frame. Thus, a total of the time for which light is emitted in each sub-frame is emission time for each light emitting element in one frame. By varying this emission time for each light emitting element to have various combinations in one pixel, various display colors with different luminosity and chromaticity can be made.

As in the sub-frame 504, when forcible termination of a retention period of a row for which writing has been already completed and which is moved into the retention period is required before writing for the last row is completed, it is preferable that an erasing period 504c be provided after the retention period 504b and a row be controlled so as to be in a non-emitting state forcibly. Then, the row forcibly made to be in the non-emitting state is kept in the non-emitting state for a certain period (this period is referred to as a non-emission period 504d). Then, immediately after the writing period 504a of the last row is completed, the rows are sequentially moved into the writing period (or the next frame), starting from the first row. This makes it possible to prevent the writing period 504a of the sub-frame 504 from overlapping with the writing period of the next sub-frame.

Although the sub-frames 501 to 504 are arranged in the order from the longest retention period to the shortest in this embodiment mode, the arrangement as in this embodiment mode is not always necessary. For example, the sub-frames 501 to 504 may be arranged in the order from the shortest retention period to the longest, or may be arranged in random order. In addition, the sub-frames may be further divided into a plurality of frames. In other words, scanning of the gate signal lines may be performed plural times while giving the same image signal.

Now, an operation of the circuit shown in FIG. 3 in a writing period and an erasing period will be explained.

First, an operation in a writing period will be explained. In the writing period, the gate signal line 911 in row n (n is a natural number) is electrically connected to the writing gate signal line driving circuit 913 through the switch 918, and unconnected to the erasing gate signal line driving circuit 914. In addition, the source signal line 912 is electrically connected to the source signal line driving Circuit 915 through the switch 920. Here, a signal is inputted into the gate of the first transistor 901 connected to the gate signal line 911 in row n (n is a natural number) to turn on the first transistor 901. Then, at this time, image signals are inputted concurrently into the source signal lines 912 in the first to the last columns. It is to be noted that the image signals inputted from the source signal lines 912 in the respective columns are independent of each other. The image signal inputted from the source signal line 912 is inputted into the gate electrode of the second transistor 902 through the first transistor 901 connected to each of the source signal lines 912. At this time, whether the light emitting element 903 emits light or not is determined depending on the signal imputed to the second transistor 902. For example, when the second transistor 902 is a p-channel transistor, the light emitting element 903 emits light by inputting a Low Level signal to the gate electrode of the second transistor 902. On the other hand, when the second transistor 902 is an n-channel transistor, the light emitting element 903 emits light by inputting a High Level signal to the gate electrode of the second transistor 902.

Next, an operation in an erasing period will be explained. In the erasing period, the gate signal line 911 in row n (n is a natural number) is electrically connected to the erasing gate signal line driving circuit 914 through the switch 919 and unconnected to the wiring gate signal line driving circuit 913. In addition, the source signal line 912 is electrically connected to the power source 916 through the switch 920. Here, a signal is inputted into the gate of the first transistor 901 connected to the gate signal line 911 in row n to turn on the first transistor 901. Then, at this moment, erasing signals are inputted concurrently into the source signal lines 912 in the first to last columns. The erasing signal inputted from the source signal lines 912 is inputted into the gate electrode of the second transistor 902 through the first transistor 901 connected to each of the source signal lines. At this moment, current supply from the current-supply line 917 to the light emitting element 903 is stopped by the signal inputted into the second transistor 902. Then, the light emitting element 903 is forcibly made to emit no light. For example, when the second transistor 902 is a p-channel transistor, the light emitting element 903 emits no light by inputting a High Level signal to the gate electrode of the second transistor 902. On the other hand, when the second transistor 902 is an n-channel transistor, the light emitting element 903 emits no light by inputting a Low Level signal to the gate electrode of the second transistor 902.

It is to be noted that, as for row n (n is a natural number), signals for erasing are inputted by the operation as described above in an erasing period. However, as described above, another row (referred to as row m (m is a natural number)) may be in a writing period while row n is in an erasing period. In such a case, it is necessary to input a signal for erasing into row n and input a signal for writing into row m by using a source signal line in the same column. Therefore, an operation that will be explained below is preferable.

Immediately after the light emitting element 903 in row n is made to emit no light by the operation in the erasing period as explained above, the gate signal line 911 and the erasing gate signal line driving circuit 914 are made to be unconnected to each other, and the switch 920 is switched to connect the source signal line 912 and the source signal line driving circuit 915. Then, in addition to connecting the source signal line 912 to the source signal line driving circuit 915, the gate signal line 911 is connected to the writing gate signal line driving circuit 913. Then, a signal is inputted selectively into the gate signal line 911 in row m from the writing gate signal line driving circuit 913 to turn on the first transistor 901, and signals for writing are inputted into the source signal lines 912 in the first to last columns from the source signal line driving circuit 915. This signal makes the light emitting element 903 in row m be in an emitting or non-emitting state.

Immediately after the writing period for row m is completed as described above, an erasing period for row n+1 is started. For that purpose, the gate signal line 911 and the writing gate signal line driving circuit 913 are made to be unconnected to each other, and the switch 920 is switched to connect the source signal line 912 and the power source 916. Further, the gate signal line 911, which is unconnected to the writing gate signal line driving circuit 913, is made to be connected to the erasing gate signal line driving circuit 914. Then, a signal is inputted selectively into the gate signal line 911 in row n+1 from the erasing gate signal line driving circuit 914 to turn on the first transistor 901, and an erasing signal is inputted from the power source 916. Immediately after the erasing period for row n+1 is thus completed, a writing period for the row (m+1) is started. Then, an erasing period and a writing period may be repeated in the same way until an erasing period for the last row is completed.

Although a mode in which the writing period for row m is provided between the erasing period for row n and the erasing period for row n+1 is explained in this embodiment mode, the present invention is not limited thereto. The writing period for row m may be provided between an erasing period for row n−1 and an erasing period for row n as well.

In addition, in this embodiment mode, an operation is repeated, in which the erasing gate signal line driving circuit 914 and one gate signal line 911 are made to be unconnected to each other as well as the writing gate signal line driving circuit 913 and another gate signal line are made to be connected to each other when the non-emission period 504d is provided as in the sub-frame 504. This type of operation may also be performed in a frame in which a non-emission period is not particularly provided.

Embodiment Mode 4

One mode of a light emitting device including a light emitting element of the present invention will be described with reference to cross-sectional views in FIGS. 6A to 6C.

In each of FIGS. 6A to 6C, a portion surrounded by a dotted line is a transistor 11 provided for driving a light emitting element 12 of the present invention. The light emitting element 12 is a light emitting element of the present invention described in Embodiment Mode 1. A drain of the transistor 11 and the first electrode 13 are electrically connected to each other by a wiring 17 running through a first interlayer insulating film 16 (16a, 16b, and 16c). In addition, the light emitting element 12 is separated by a partition layer 18 from another light emitting element that is provided adjacently. A light emitting device having such a structure of the present invention is provided over a substrate 10 in this embodiment mode.

It is to be noted that the transistor 11 shown in each of FIGS. 6A to 6C is a top-gate TFT in which a gate electrode is provided on an opposite side of a substrate with a semiconductor layer as a center. However, a structure of the transistor 11 is not particularly limited. For example, a bottom-gate TFT may be used. In the case of a bottom-gate TFT, a TFT where a protective film is formed over a semiconductor layer that forms a channel (a channel-protected TFT) may be employed, or a TFT where a part of a semiconductor layer that forms a channel is depressed (a channel-etched TFT) may be employed.

In addition, a semiconductor layer which forms the transistor 11 may be either crystalline or amorphous, or alternatively, semi-amorphous or the like.

The following will describe a semi-amorphous semiconductor. The semi-amorphous semiconductor is a semiconductor that has an intermediate structure between amorphous and crystalline (including single-crystal or polycrystalline) structures and has a third state that is stable in terms of free energy, which includes a crystalline region that has short range order and lattice distortion. Further, a crystal grain of 0.5 to 20 nm is included in at least a region in a film of the semi-amorphous semiconductor. Raman spectrum is shifted to a wave number side lower than 520 cm$^{-1}$. The diffraction peaks of (111) and (220), which are believed to be derived from silicon crystal lattice, are observed by the X-ray diffraction. The semi-amorphous semiconductor contains hydrogen or halogen of at least 1 atomic % or more for terminating dangling bonds. The semi-amorphous semiconductor is also referred to as a so-called microcrystalline semiconductor. A microcrystalline semiconductor can be formed by glow discharge decomposition (using plasma CVD) with a gas selected from $SiH_4$, $Si_2H_6$, $SiH_2Cl_2$, $SiHCl_3$, $SiCl_4$, or $SiF_4$. Each of these gases may also be diluted with $H_2$, or a mixture of $H_2$ and one or more of rare gas elements of He, Ar, Kr, and Ne. The dilution ratio is set to be in a range of 1:2 to 1:1000. The pressure is set to be approximately in the range of 0.1 to 133 Pa. The power frequency is set to be 1 to 120 MHz, preferably, 13 to 60 MHz. The substrate heating temperature may be set to be 300° C. or lower, more preferably, 100 to 250° C. As for impurity elements contained in the film, each concentration of impurities for atmospheric constituents such as oxygen, nitrogen and carbon is preferably set to be $1 \times 10^{20}/cm^3$ or lower. In particular, the oxygen concentration is set to be $5 \times 10^{19}/cm^3$ or less, preferably, $1 \times 10^{19}/cm^3$ or less.

Further, as specific examples of a crystalline semiconductor layer, a semiconductor layer formed of single-crystal or polycrystalline silicon, or silicon-germanium is given, which may be formed by laser crystallization or may be faulted by crystallization with a solid-phase growth method using an element such as nickel.

In the case of using an amorphous substance, for example, amorphous silicon to form the semiconductor layer, it is preferable that the light emitting device have a circuit in which the transistor 11 and another transistor (a transistor constituting a circuit for driving the light emitting element) are all n-channel transistors. Other than that case, the light emitting device may have a circuit including one of an n-channel transistor and a p-channel transistor or may have a circuit including both of an n-channel transistor and a p-channel transistor.

Further, the first interlayer insulating film 16 may be multilayered as shown in FIGS. 6A to 6C, or may be a single layer. It is to be noted that the first interlayer insulating film 16a contains an inorganic substance such as silicon oxide or silicon nitride, and the first interlayer insulating film 16b contains acrylic, siloxane (siloxane is a compound which its skeleton structure is structured by a bond between silicon (Si) and oxygen (O), and has an organic group such as a fluoro group or an alkyl group as a substituent group), or silicon oxide that can be formed by being coated. In addition, the first interlayer insulating film 16c includes a silicon nitride film containing argon (Ar). The substances constituting each of the layers are not particularly limited; therefore, substances other than the substances mentioned here may also be used. Moreover, a layer containing a substance other than these substances may also be combined. In this way, both of an inorganic substance and an organic substance, or one of an inorganic substance and an organic substance may be used to form the first interlayer insulating film 16.

As for the partition layer 18, it is preferable that an edge portion have a shape varying continuously in curvature radius. In addition, a substance such as acrylic, siloxane, resist, or silicon oxide is used to form the partition layer 18. One or both of an inorganic substance and an organic substance may be used to form the partition layer 18.

In each of FIGS. 6A and 6C, only the first interlayer insulating film 16 is provided between the transistor 11 and the light emitting element 12. However, as shown in FIG. 6B, a second interlayer insulating film 19 (19a and 19b) may be provided in addition to the first interlayer insulating film 16 (16a and 16b). In the light emitting device shown in FIG. 6B, the first electrode 13 is connected to the wiring 17 running through the second interlayer insulating film 19.

The second interlayer insulating film 19 may be multilayered or a single layer as in the case of the first interlayer insulating film 16. The second interlayer insulating film 19a contains acrylic, siloxane, or silicon oxide or the like that can be formed by being coated. In addition, the second interlayer insulating film 19b includes a silicon nitride film containing argon (Ar). The substances constituting the respective layers are not particularly limited; therefore, substances other than the substances mentioned here may also be used. Moreover, a layer containing a substance other than these substances may also be combined. In this way, both of an inorganic substance and an organic substance, or one of an inorganic substance and an organic substance may be used to form the second interlayer insulating film 19.

In the light emitting element 12, in a case where both of the first electrode and the second electrode are formed by using a light transmitting substance, emitted light can be extracted from both of the first electrode 13 side and the second electrode 14 side as indicated by outline arrows of FIG. 6A. In the case where only the second electrode 14 is formed by using a light transmitting substance, emitted light can be extracted from only the second electrode 14 side as indicated by an outline arrow of FIG. 6B. In this case, it is preferable that the first electrode 13 be formed by using a highly reflective material, or a film composed of a highly reflective material (a reflective film) be provided below the first electrode 13. Further, in the case where only the first electrode 13 is formed by using a light transmitting substance, emitted light can be extracted from only the first electrode 13 side as indicated by an outline arrow of FIG. 6C. In this case, it is preferable that the second electrode 14 be formed by using a highly reflective material, or a reflective film be provided above the second electrode 14.

In addition, the layer 15 may be stacked so that the light emitting element 12 is operated when a voltage is applied so as to make the potential of the second electrode 14 higher than that of the first electrode 13. Alternatively, the layer 15 may be stacked so that the light emitting element 12 is operated when a voltage is applied so as to make the potential of the second electrode 14 lower than that of the first electrode 13. The transistor 11 is an n-channel transistor in the former case, and the transistor 11 is a p-channel transistor in the latter case.

Figure 7:
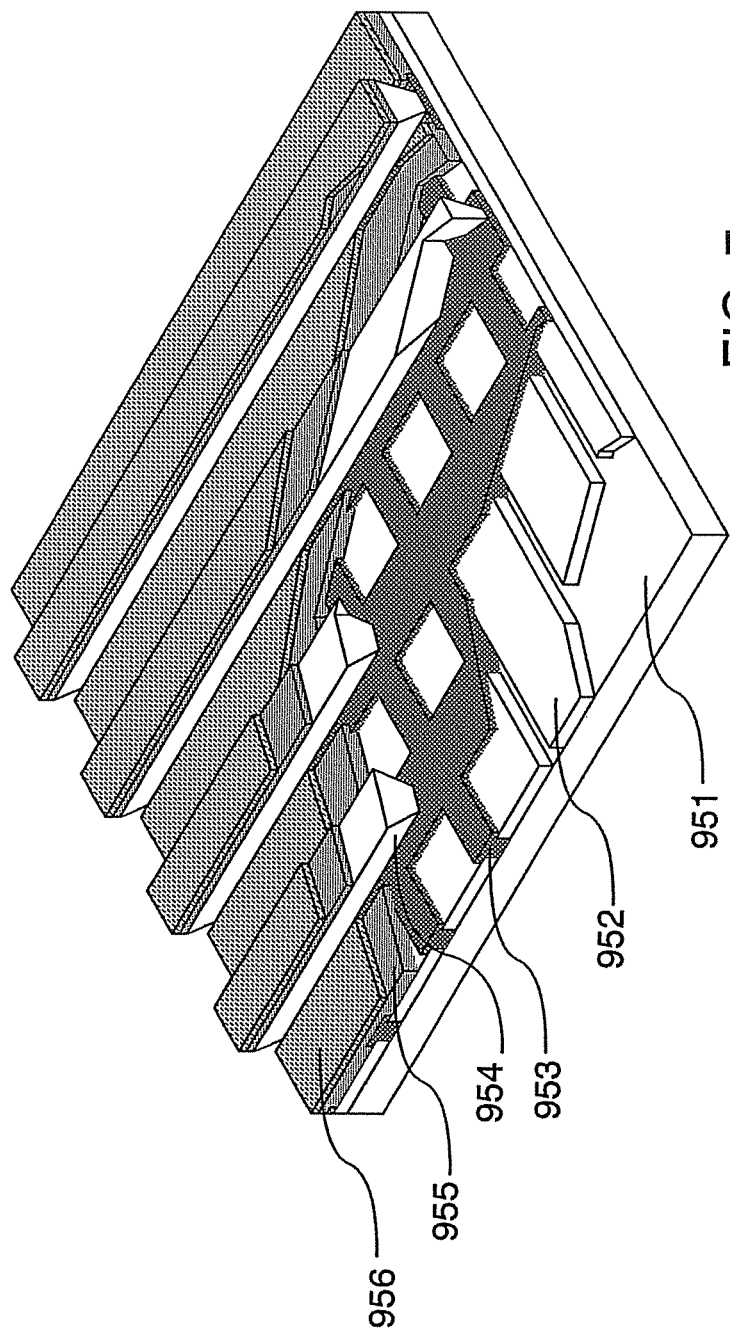
FIG. 7 describes one mode of a light emitting device of the present invention.

In this embodiment mode, an active type light emitting device that controls driving of a light emitting element by a transistor is described as in the above. However, the light emitting element may also be a passive type that drives a light emitting element without particularly providing an element for driving such as a transistor. FIG. 7 is a perspective view of a passive type light emitting device manufactured by applying the present invention. The light emitting device in FIG. 7 includes a light emitting element of the present invention having a structure where a layer 955 including a light emitting layer and the like is provided between an electrode 952 and an electrode 956, over a substrate 951. End portions of the electrode 952 are covered with an insulating layer 953. Further, a partition layer 954 is provided over the insulating layer 953. Side walls of the partition layer 954 are sloped so that a distance between one side wall and the other becomes shorter towards a substrate surface. In other words, a cross-section in a short side direction of the partition layer 954 has a trapezoidal shape, for which a bottom side (a side facing a similar direction as a surface direction of the insulating layer 953, and is in contact with the insulating layer 953) is shorter than an upper side (a side facing a similar direction as the surface direction of the insulating layer 953, and is not in contact with the insulating layer 953). In this manner, by providing the partition layer 954, malfunctioning of a light emitting element due to static and the like can be prevented. Also, in a passive type light emitting device, by including a light emitting element of the present invention that operates with low driving voltage, driving with low power consumption is possible.

Embodiment Mode 5

Since a light emitting device using a light emitting element of the present invention as a pixel or a light source can be operated with good current efficiency, an electronic appliance that can be operated with low power consumption can be obtained by using such a light emitting device for a display portion.

Figure 8A:
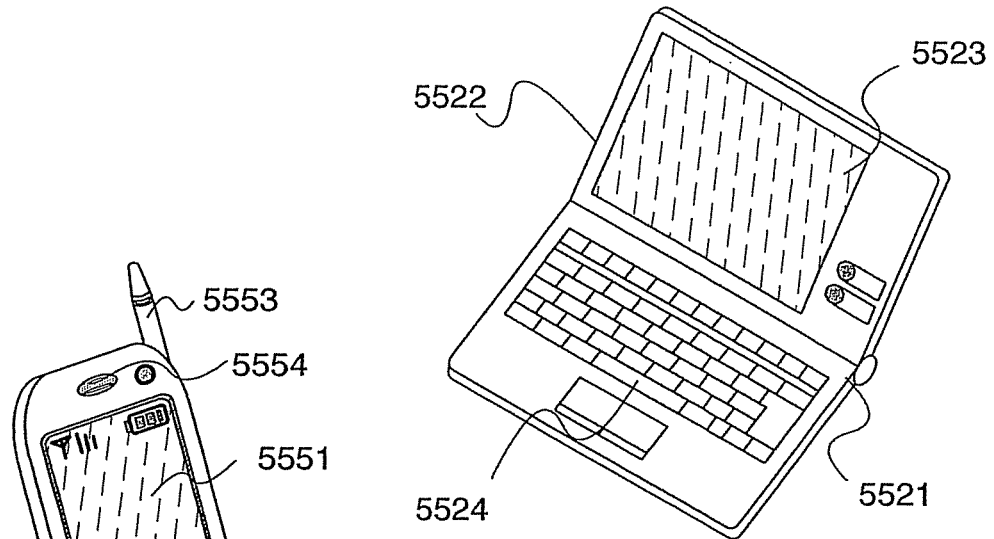
FIGS. 8A to 8C each describe one mode of an electronic appliance applying the present invention.
Figure 8B:
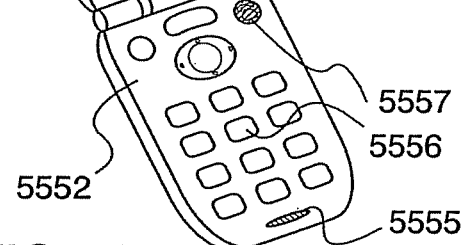
Figure 8C:
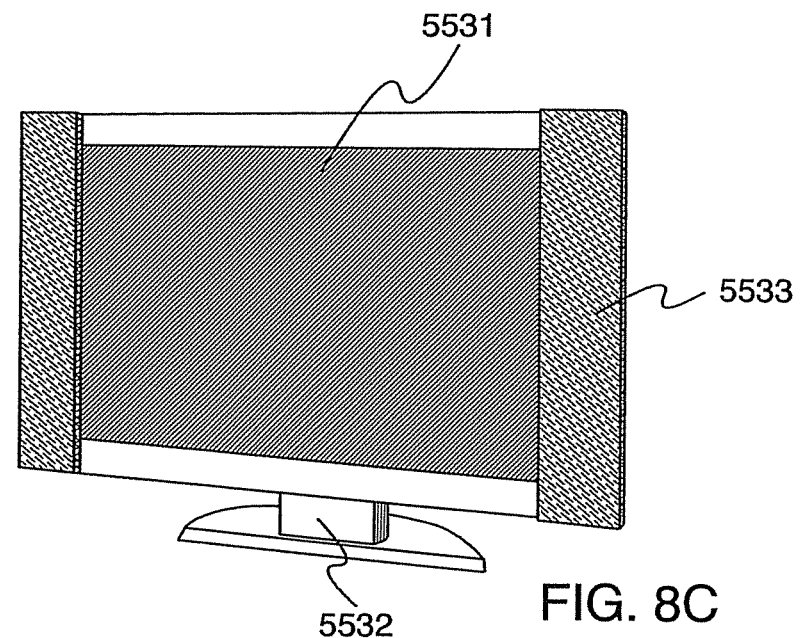

An embodiment of an electronic appliance mounted with a light emitting device to which the present invention is applied, is shown in each of FIGS. 8A to 8C.

Figure 9:
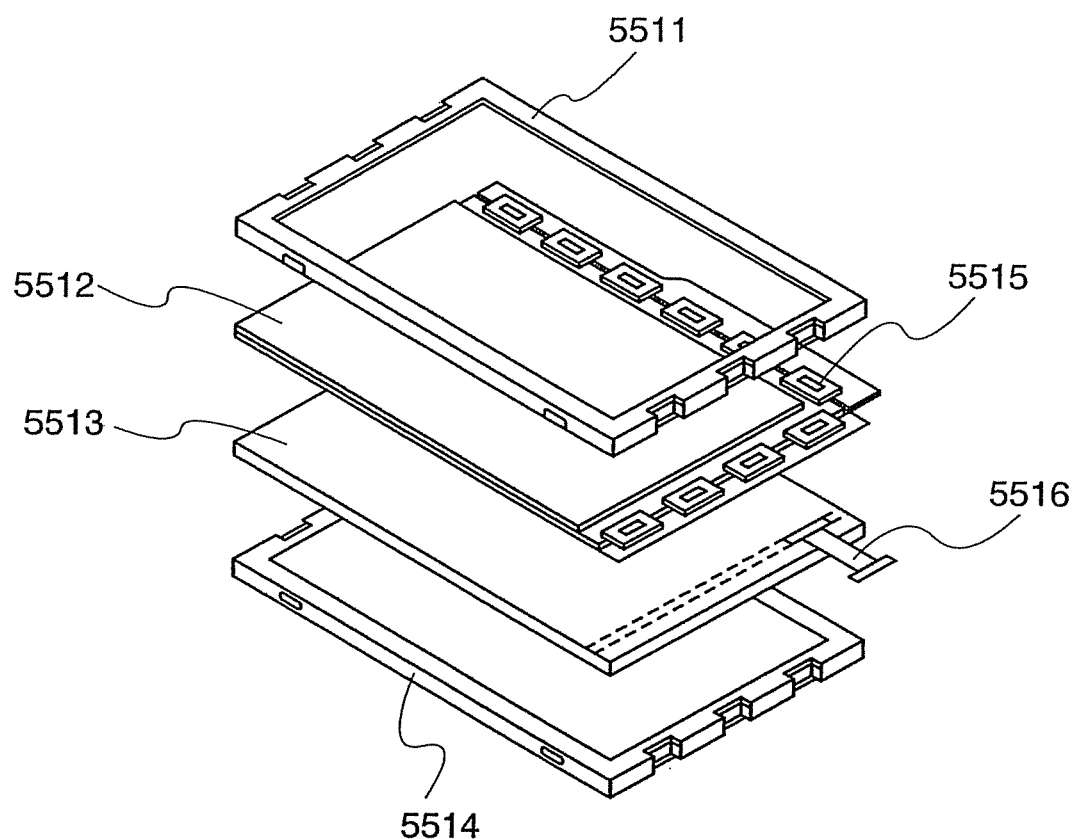
FIG. 9 describes one mode of an electronic appliance applying the present invention.

FIG. 8A is a computer manufactured by applying the present invention, which includes a main body 5521, a housing 5522, a display portion 5523, a keyboard 5524, and the like. The computer which can be operated with low power consumption can be completed by incorporating a light emitting device (for example, a light emitting device including a structure such as those described in Embodiment Modes 3 and 4) including the light emitting element of the present invention as described in Embodiment Mode 1 as the display portion. Further, the computer can also be completed by incorporating as a backlight a light emitting device using the light emitting element of the present invention as a light source. Specifically, a lighting device in which a liquid crystal device 5512 and a light emitting device 5513 are fit into a housing 5511 and a housing 5514, may be incorporated as a display portion as shown in FIG. 9. Note that in FIG. 9, an external input terminal 5515 is attached to the liquid crystal device 5512, and an external input terminal 5516 is attached to the light emitting device 5513.

FIG. 8B is a telephone set manufactured by applying the present invention, in which a main body 5552 includes a display portion 5551, an audio output portion 5554, an audio input portion 5555, operation switches 5556 and 5557, an antenna 5553, and the like. The telephone set which can be operated with low power consumption can be completed by incorporating a light emitting device including the light emitting element of the present invention as the display portion.

FIG. 8C is a television set manufactured by applying the present invention, which includes a display portion 5531, a housing 5532, a speaker 5533, and the like. The television set which can be operated with low power consumption can be completed by incorporating a light emitting device including the light emitting element of the present invention as the display portion.

As in the above, the light emitting device of the present invention is extremely suitable to be used as a display portion for various electronic appliances. Note that the electronic appliance is not limited to those mentioned in this embodiment mode, and may be other electronic appliances as a navigation device and the like.

Embodiment 1

Figure 10:
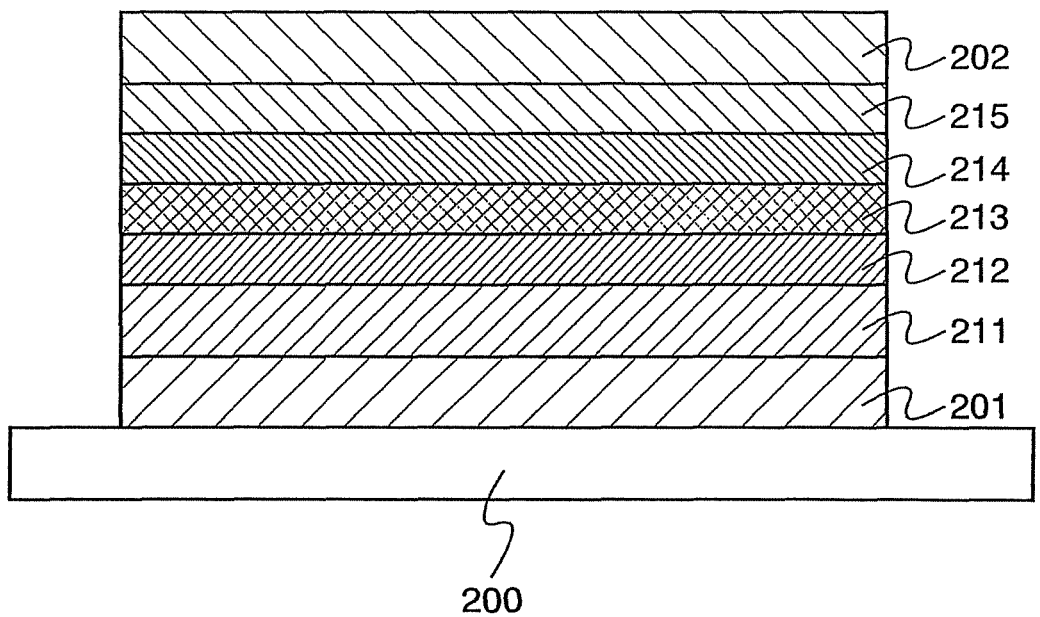
FIG. 10 describes a light emitting element that is manufactured in Embodiment 1.

In this embodiment, two light emitting elements: a light emitting element (1) manufactured by using TAZ as an electron transporting substance; and a light emitting element (2) manufactured by using BCP as an electron transporting substance, are described with reference to FIG. 10. These light emitting elements are formed using a different electron transporting substance from each other; however, other structures are similar. Note that the light emitting element (1) corresponds to the combination (1) in Table 1, and the light emitting element (2) corresponds to the combination (2) in Table 1.

First, a first electrode 201 is formed by a sputtering method using indium tin oxide including silicon oxide, over a substrate 200. The first electrode 201 is formed to have a thickness of 110 nm.

Subsequently, a first layer 211 including DNTPD is formed by an evaporation method over the first electrode 201 so as to have a thickness of 40 nm. The first layer 211 formed in this manner functions as a hole injecting layer.

Subsequently, a second layer 212 including TCTA is formed by an evaporation method over the first layer 211 so as to have a thickness of 20 nm. The second layer 212 functions as a hole transporting layer.

Subsequently, a third layer 213 including CBP and Ir(Fdppr-Me)$_2$acac represented in Structural Formula (16) is formed by a co-evaporation method over the second layer 212 so as to have a thickness of 30 nm. Also, CBP and Ir(Fdppr-Me)$_2$acac are to have a weight ratio of 1:0.05 (=CBP:Ir(Fdppr-Me)$_2$acac). Consequently, Ir(Fdppr-Me)$_2$acac is in a state where it is dispersed in a layer made of CBP. The third layer 213 functions as a light emitting layer, and Ir(Fdppr-Me)$_2$acac functions as a light emitting substance.

For the light emitting element (1), a fourth layer 214 is formed over the third layer 213 by an evaporation method using TAZ so as to have a thickness of 20 nm. Also, for the light emitting element (2), a fourth layer 214 made from BCP is formed over the third layer 213 by an evaporation method so as to have a thickness of 20 nm. The fourth layers 214 each function as an electron transporting layer.

For the light emitting element (1), a fifth layer 215 including TAZ and lithium is formed over the fourth layer 214 by a co-evaporation method so as to have a thickness of 30 nm. A weight ratio of TAZ and lithium is to be 1:0.01 (=TAZ:lithium). Also, for the light emitting element (2), a fifth layer 215 including BCP and lithium is formed over the fourth layer 214 so as to have a thickness of 30 nm. Further, a weight ratio of BCP and lithium is to be 1:0.01 (=BCP:lithium).

A second electrode 202 is formed over the fifth layer 215 by an evaporation method using aluminum. The second electrode 202 is to have a thickness of 200 nm.

In the above manner, each of the light emitting elements (1) and (2) is manufactured. Note that in the light emitting elements (1) and (2), the first electrode 201 and the second electrode 202 are formed so that each have a surface for extracting emitted light, with an area of 4 mm$^2$.

Characteristics obtained by applying voltage to each of the light emitting elements (1) and (2) manufactured in the above manner, so that the potential of the first electrode 201 is higher than the potential of the second electrode 202 and the light emitting elements (1) and (2) emit light, are described in the following.

Figure 11:
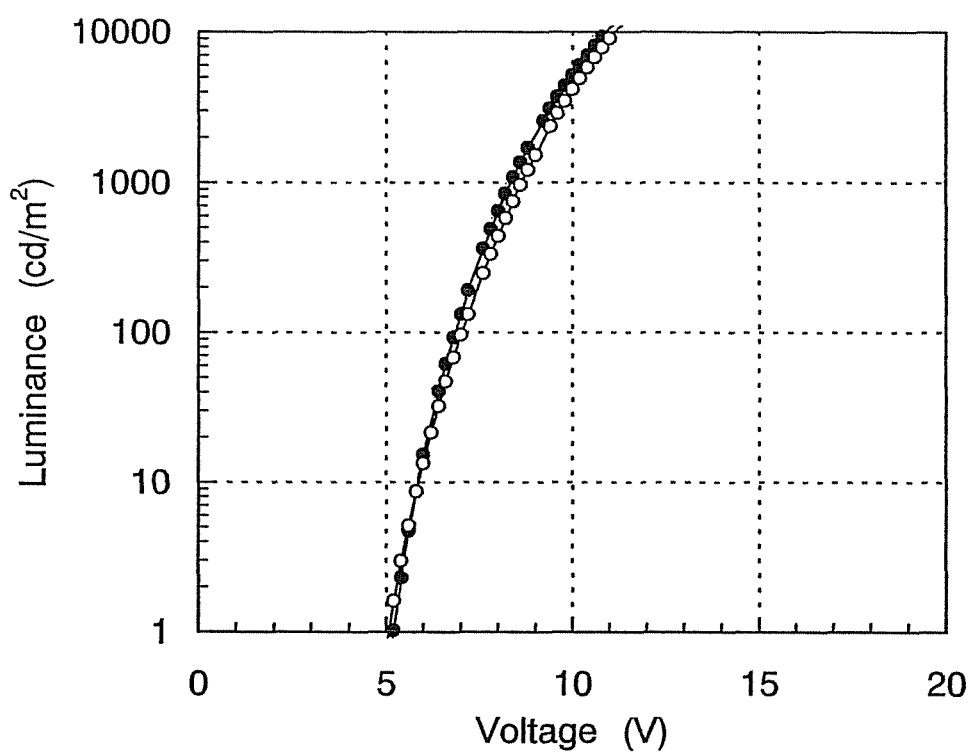
FIG. 11 shows a voltage-luminance characteristic of a light emitting element that is manufactured in Embodiment 1.
Figure 12:
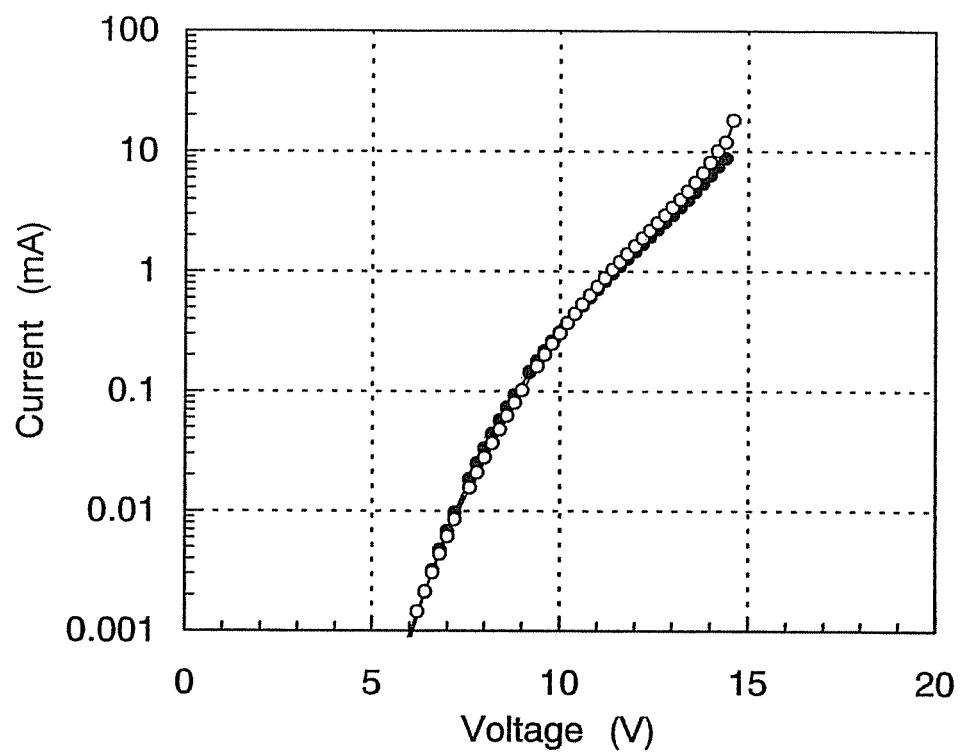
FIG. 12 shows a voltage-current characteristic of a light emitting element that is manufactured in Embodiment 1.
Figure 13:
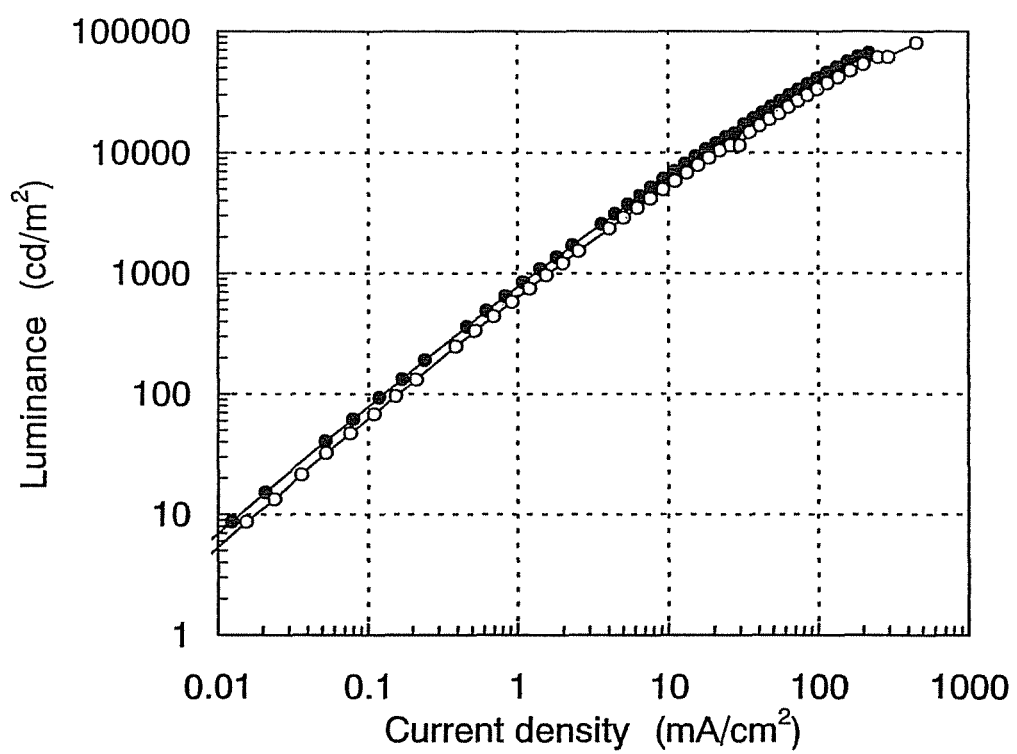
FIG. 13 shows a current density-luminance characteristic of a light emitting element that is manufactured in Embodiment 1.
Figure 14:
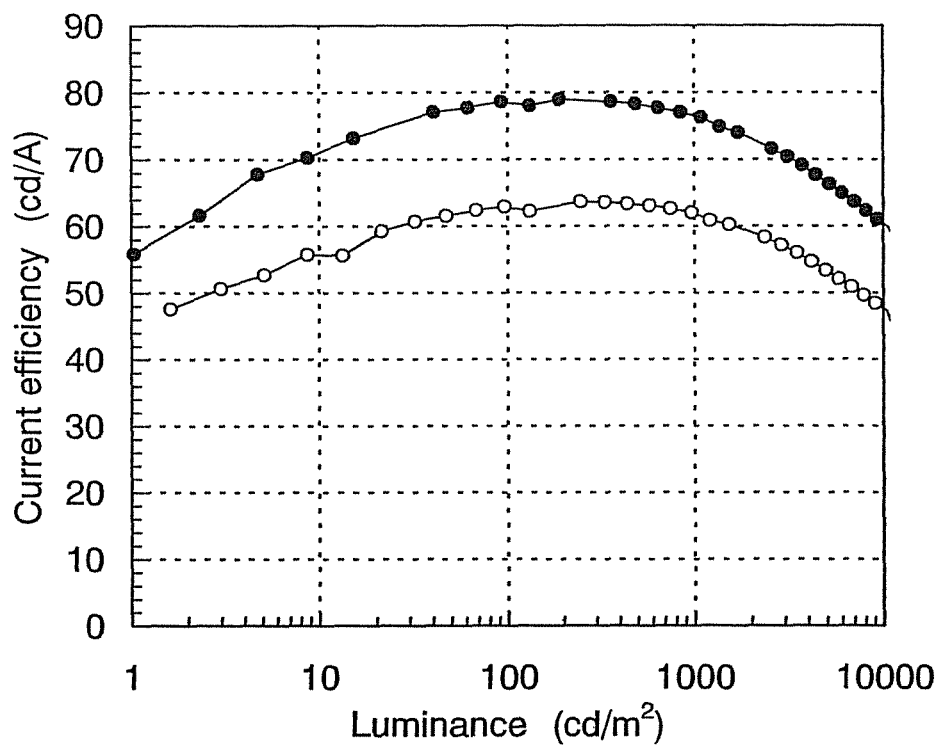
FIG. 14 shows a luminance-current efficiency characteristic of a light emitting element that is manufactured in Embodiment 1.
Figure 15A:
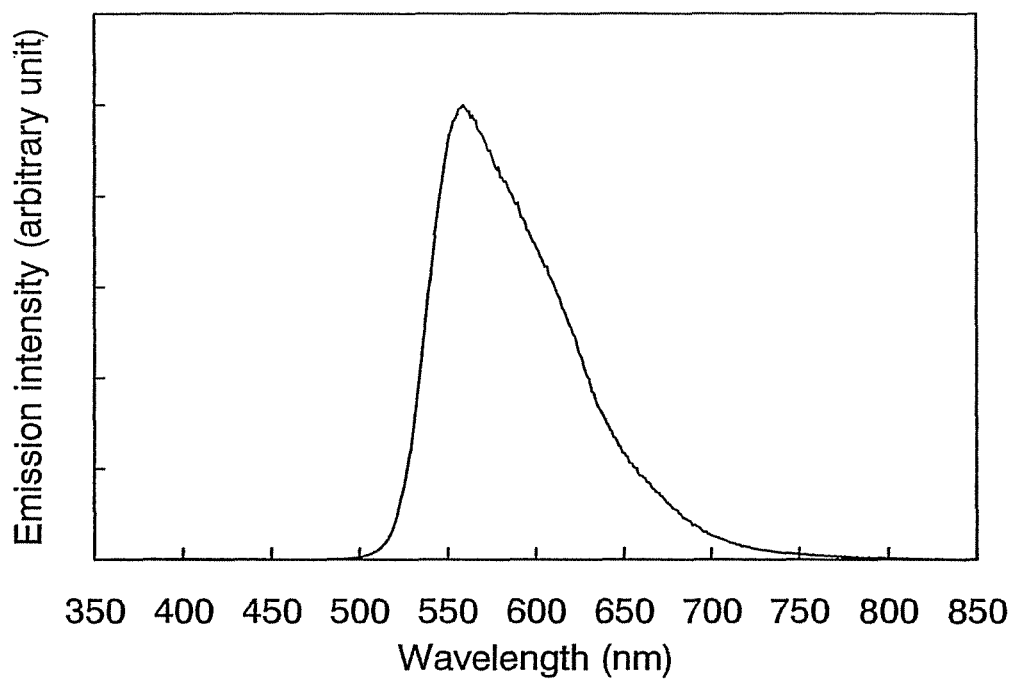
FIGS. 15A and 15B each show an emission spectrum of a light emitting element that is manufacture in Embodiment 1.
Figure 15B:
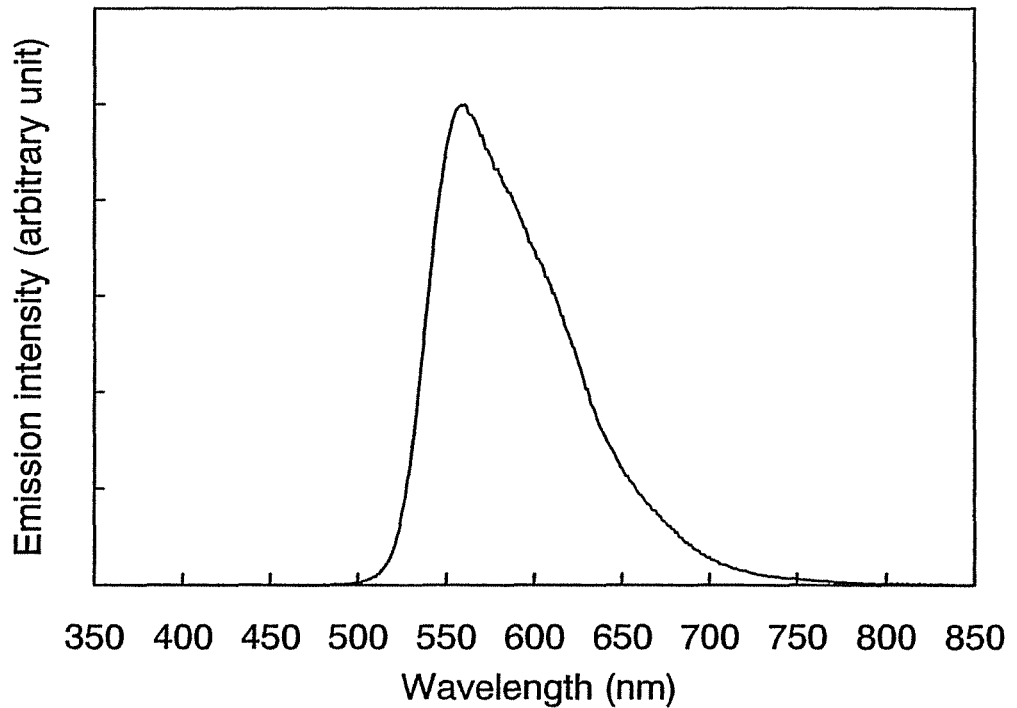

Each of FIG. 11, FIG. 12, FIG. 13, and FIG. 14 shows a graph plotting a voltage vs luminance characteristic, a voltage vs current characteristic, a current density vs luminance characteristic, and a luminance vs current efficiency characteristic, respectively. In FIG. 11, the horizontal axis represents voltage (V), and the vertical axis represents luminance (cd/m$^2$). In FIG. 12, the horizontal axis represents voltage (V), and the vertical axis represents current (mA). In FIG. 13, the horizontal axis represents current density (mA/cm$^2$), and the vertical axis represents luminance (cd/m$^2$). In FIG. 14, the horizontal axis represents luminance (cd/m$^2$), and the vertical axis represents current efficiency (cd/A). Also, in FIGS. 11 to 14, the light emitting element (1) is plotted with "•," and the light emitting element (2) is plotted with "○." Further, FIG. 15 shows an emission spectrum that is obtained when a current of 1 mA is fed to the light emitting element (1), and FIG. 15B shows an emission spectrum that is obtained when a current of 1 mA is fed to the light emitting element (2). In FIGS. 15A and 15B, the horizontal axis represents wavelength (nm) and the vertical axis represents emission intensity (an arbitrary unit).

Figure 16:
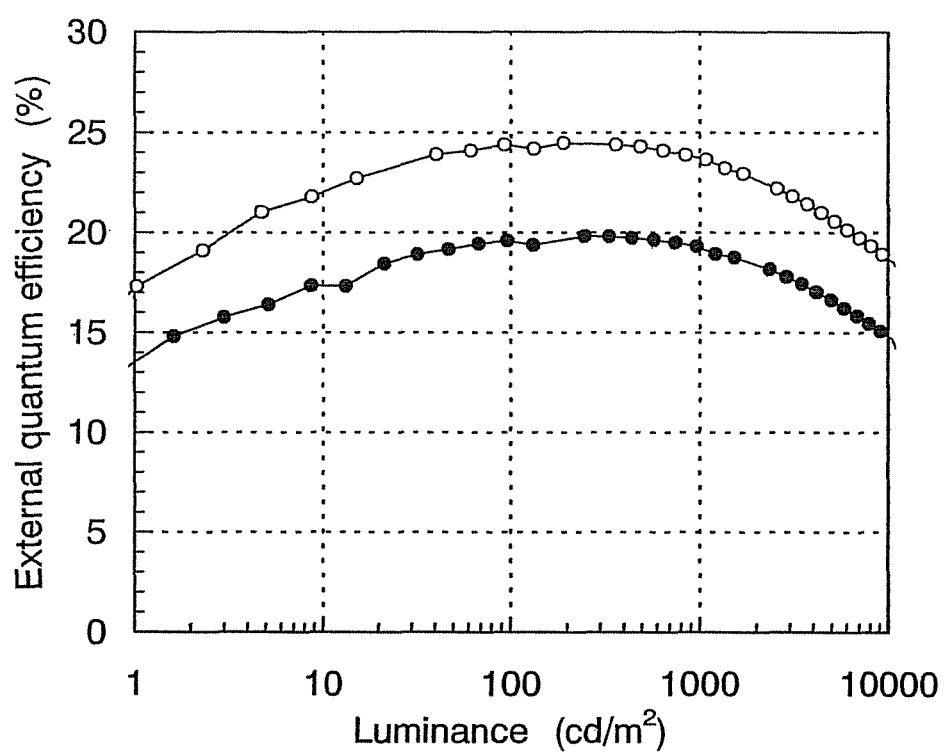
FIG. 16 shows a luminance-external quantum efficiency of a light emitting element that is manufactured in Embodiment 1.

From FIGS. 11 to 14, it is observed that both of the light emitting elements (1) and (2) emit light efficiently. In particular, it is observed that the light emitting element (1) is a light emitting element with extremely excellent current efficiency. From FIGS. 15A and 15B, it is observed that yellow light emission that is derived from Ir(Fdppr-Me)$_2$acac is obtained for both of the light emitting elements (1) and (2). FIG. 16 is a graph plotting external quantum efficiency of the light emitting elements (1) and (2), based on the current density vs luminance characteristic shown in FIG. 13 and the emission spectrum shown in FIGS. 15A and 15B. In FIG. 16, the horizontal axis represents luminance (cd/m$^2$) and the vertical axis represents external quantum efficiency (%). Also, the light emitting element (1) is plotted with "•," and the light emitting element (2) is plotted with "○." From FIG. 16, it is observed that external quantum efficiency is favorable for both of the light emitting elements (1) and (2). For the light emitting element (1) in particular, it is observed as an extremely excellent light emitting element in that there is a case where external quantum efficiency exceeds 20%.

Embodiment 2

In this embodiment, one embodiment of a light emitting element of the present invention using an organometallic complex represented in the following Structural Formula (32), which is also the organometallic complex represented in General Formula (1), is described. Note that since the light emitting element of this embodiment is similar to the light emitting element described in Embodiment 1 in that 5 layers are provided between a first electrode and a second electrode, FIG. 10 used to describe Embodiment 1 is also used to describe this embodiment.

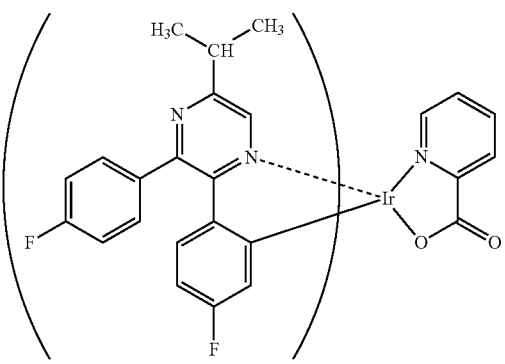

(32)

First, a first electrode 201 is formed over a substrate 200 by a sputtering method using indium tin oxide including silicon oxide. A thickness of the first electrode 201 is to be 110 nm.

Next, a first layer 211 is formed over the first electrode 201 by co-evaporating NPB and molybdenum trioxide, so as to have a thickness of 40 nm. Note that each evaporation rate of NPB and molybdenum trioxide is adjusted so that a mixture ratio of NPB and molybdenum trioxide is NPB: molybdenum trioxide=4:1, in mass ratio. The first layer 211 formed in this manner is a mixed layer including NPB that is a hole transporting substance, and molybdenum oxide that is one of metal oxides showing an electron accepting property with respect to the hole transporting substance, and has a function of generating holes.

Subsequently, a second layer 212 including TCTA is formed over the first layer 211 by an evaporation method to have a thickness of 20 nm. The second layer 212 functions as a hole transporting layer.

Then, a third layer 213 including CBP and Ir(Fdppr-iPr)$_2$(pic) that is represented by Structural Formula (32), is formed over the second layer 212 by a co-evaporation method so as to have a thickness of 30 nm. A weight ratio of CBP and Ir(Fdppr-iPr)$_2$(pic) is to be 1:0.05 (=CBP:Ir(Fdppr-iPr)$_2$(pic)). Consequently, Ir(Fdppr-iPr)$_2$(pic) is like in a state of being dispersed in a layer mainly containing CBP. The third layer 213 functions as a light emitting layer, and Ir(Fdppr-iPr)$_2$(pic) functions as a light emitting substance.

Subsequently, a fourth layer 214 including TAZ is formed over the third layer 213 by an evaporation method so as to have a thickness of 20 nm. The fourth layer 214 functions as an electron transporting layer.

A fifth layer 215 including TAZ and lithium is formed over the fourth layer 214 so as to have a thickness of 30 nm. A weight ratio of TAZ and lithium is to be 1:0.01 (=TAZ: lithium).

A second electrode 202 is formed over the fifth layer 215 by an evaporation method using aluminum. A thickness of the second electrode 202 is to be 200 nm.

The light emitting element of this embodiment is formed in the above manner. Note that in this light emitting element, the first electrode 201 is formed so as to have a surface for extracting emitted light, with an area of 4 mm$^2$.

With respect to the light emitting element manufactured in the above manner, characteristics that are obtained by applying voltage so that the potential of the first electrode 201 is higher than the potential of the second electrode 202, and when light is emitted from the light emitting element, are described in the following.

Figure 17:
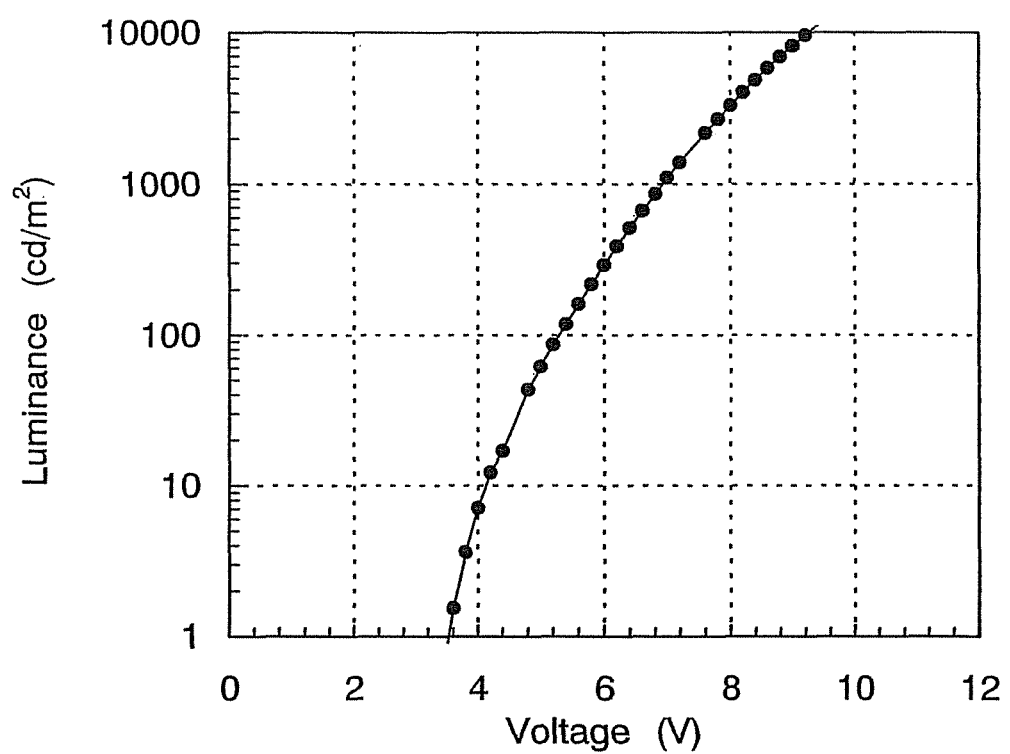
FIG. 17 shows a voltage-luminance characteristic of a light emitting element that is manufactured in Embodiment 2.
Figure 18:
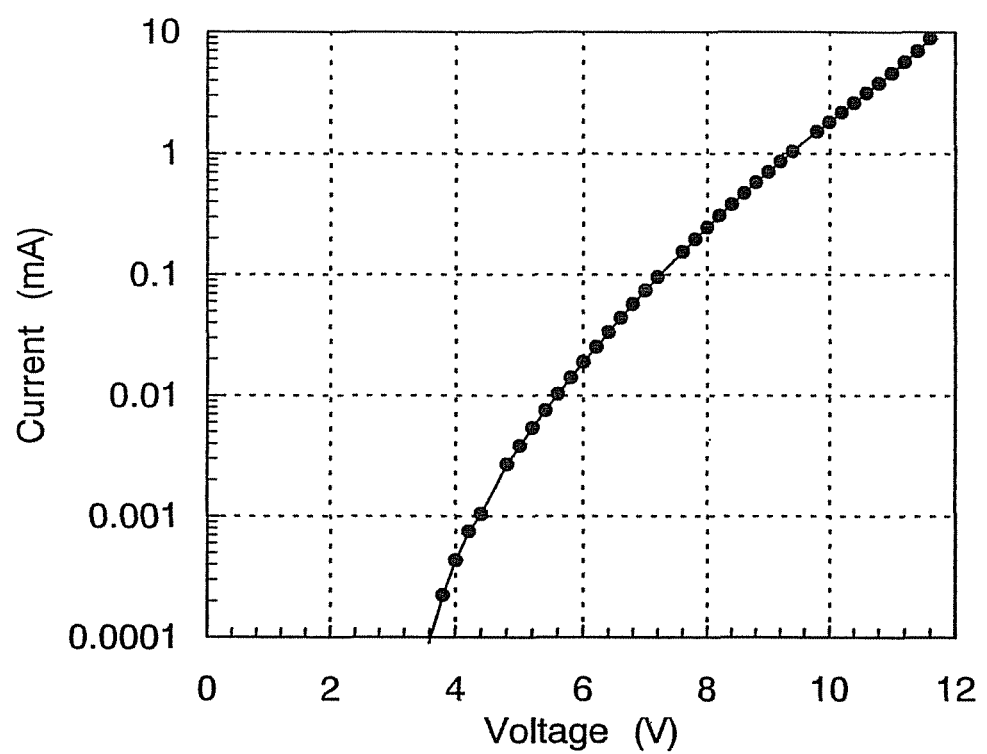
FIG. 18 shows a voltage-current characteristic of a light emitting element that is manufactured in Embodiment 2.
Figure 19:
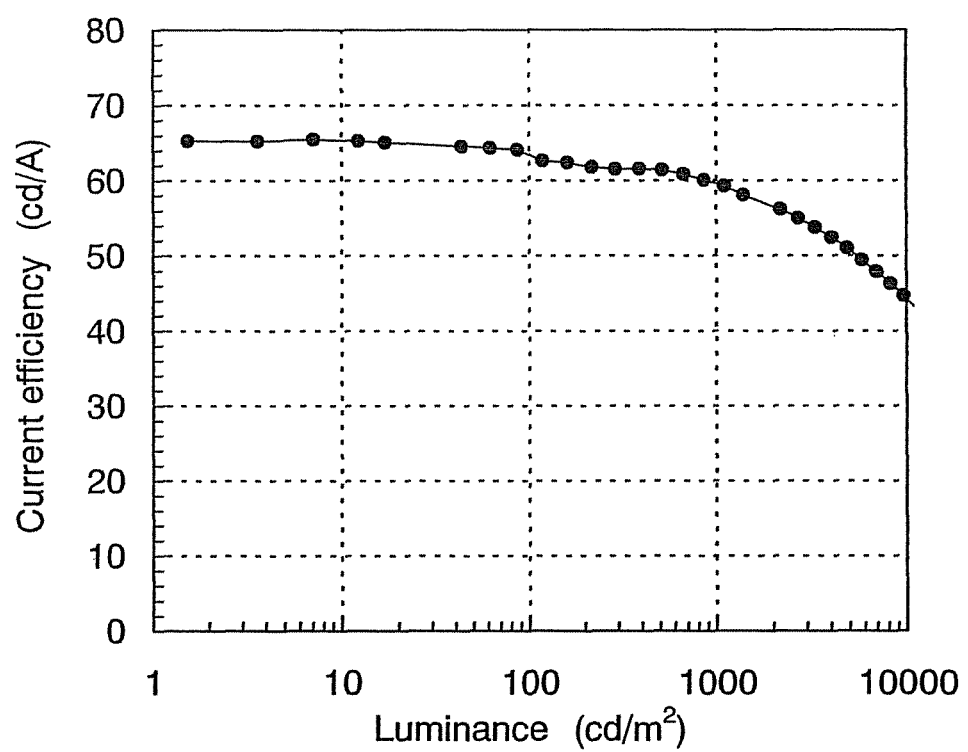
FIG. 19 shows a current density-luminance characteristic of a light emitting element that is manufactured in Embodiment 2.
Figure 20:
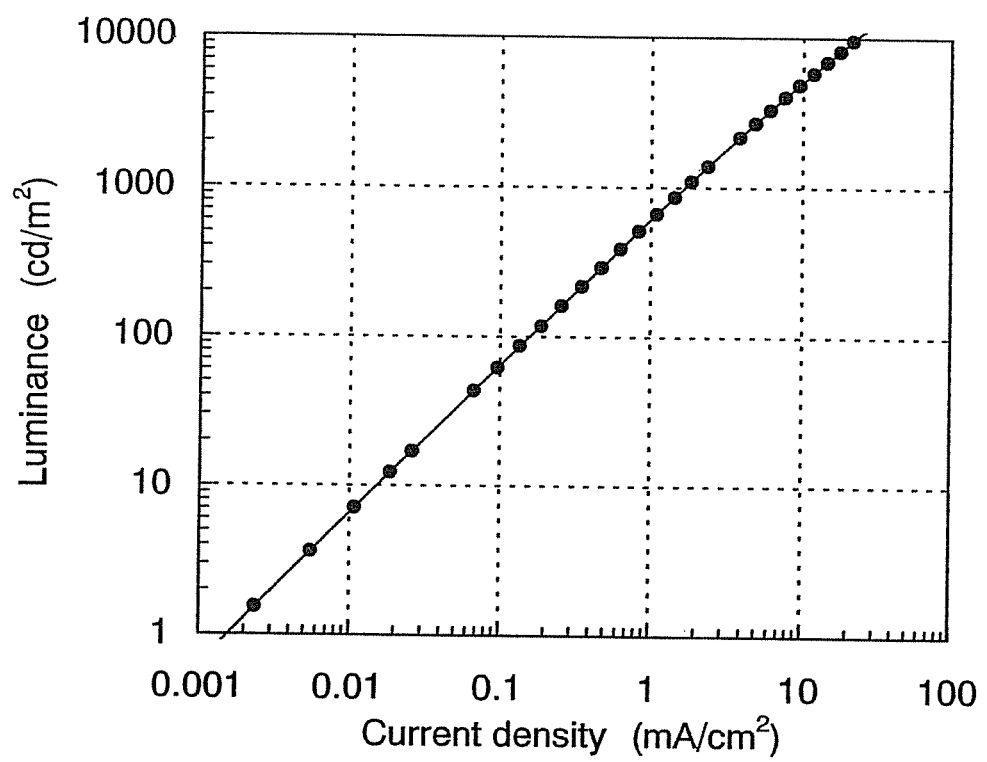
FIG. 20 shows a luminance-current efficiency characteristic of a light emitting element that is manufactured in Embodiment 2.
Figure 21:
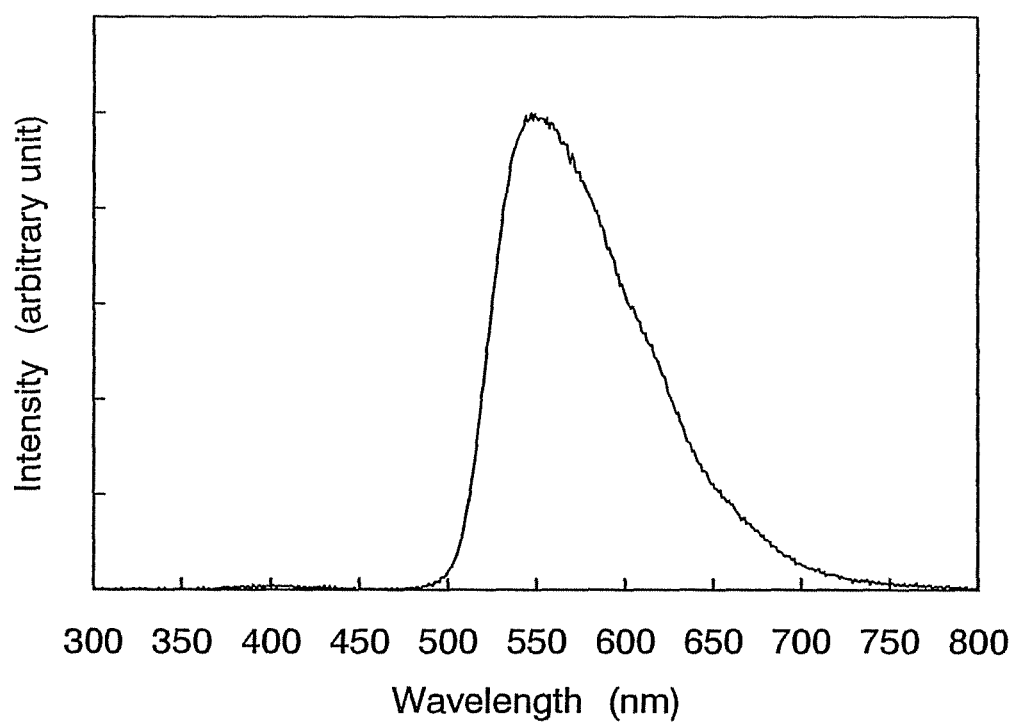
FIG. 21 shows an emission spectrum of a light emitting element that is manufactured in Embodiment 2.

Each of FIG. 17, FIG. 18, FIG. 19, and FIG. 20 shows a graph plotting a voltage vs luminance characteristic, a voltage vs current characteristic, a current density vs luminance characteristic, and a luminance vs current efficiency characteristic, respectively. In FIG. 17, the horizontal axis represents voltage (V), and the vertical axis represents luminance (cd/m$^2$). In FIG. 18, the horizontal axis represents voltage (V), and the vertical axis represents current (mA). In FIG. 19, the horizontal axis represents current density (mA/cm$^2$), and the vertical axis represents luminance (cd/m$^2$). In FIG. 20, the horizontal axis represents luminance (cd/m$^2$), and the vertical axis represents current efficiency (cd/A). Further, FIG. 21 shows an emission spectrum that is obtained when a current of 1 mA is fed to the light emitting element. In FIG. 21, the horizontal axis represents wavelength (nm) and the vertical axis represents emission intensity (an arbitrary unit).

Figure 22:
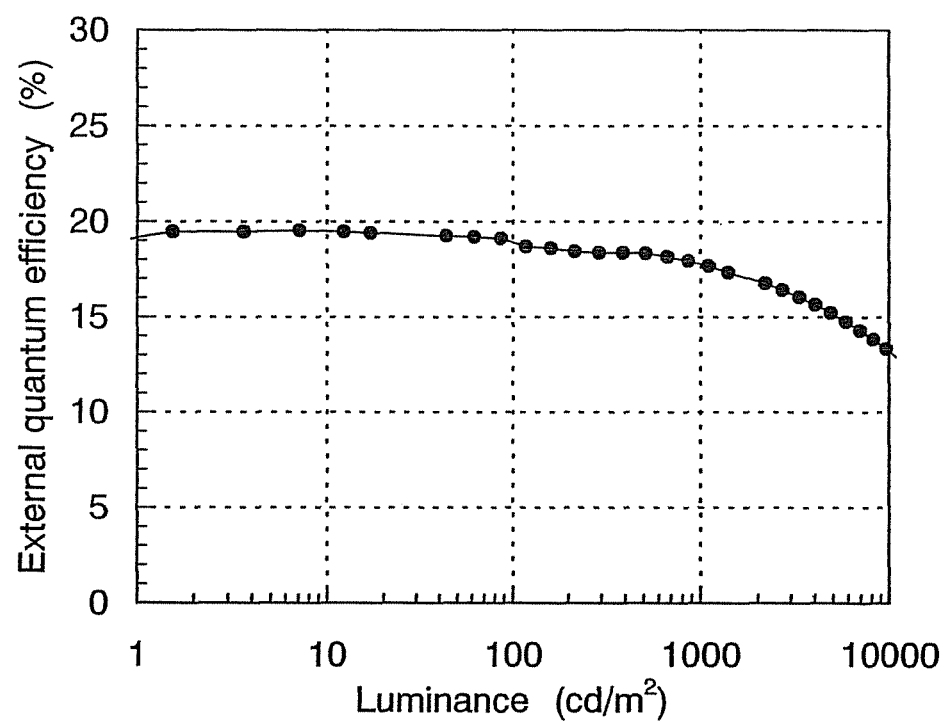
FIG. 22 shows a luminance-external quantum efficiency of a light emitting element that is manufactured in Embodiment 2.

From FIG. 21, it is observed that greenish yellow light emission that is derived from Ir(Fdppr-iPr)$_2$(pic) is obtained for the light emitting element. FIG. 22 is a graph plotting external quantum efficiency of the light emitting element, based on the current density-luminance characteristic shown in FIG. 19 and the emission spectrum shown in FIG. 21. In FIG. 22, the horizontal axis represents luminance (cd/m$^2$) and the vertical axis represents external quantum efficiency (%). From FIG. 22, it is observed that the light emitting element has favorable external quantum efficiency. It is observed that the largest value of external quantum efficiency is about 20%, and the light emitting element emits light with extremely good efficiency.

Embodiment 3

Synthesis Example 1

A synthesis method for the organometallic complex Ir(Fdppr-Me)$_2$acac that is represented by Structural Formula (16), which is the organometallic complex represented in General Formula (1), and used in Embodiment 1 is described.

A synthesis method for an organometallic complex of the present invention (referred to as: (acetylacetonato)bis[2,3-bis (4-fluorophenyl)-5-methylpyrazinato]iridium(III)) that is represented in Structural Formula (16) is described.

[Step 1: Synthesis of a Ligand (Abbreviated as: HFdppr-Me)]

First, with ethanol as a solvent, 5.31 g of 4,4'-difluorobenzil (by Tokyo Chemical Industry Co., Ltd.) and 1.60 g of 1,2-diaminopropane (by Kanto Chemical Co., Inc.) are mixed. Subsequently, the mixed solution is refluxed for three hours. Then, after the refluxed solution is condensed by using an evaporator and treated with ethanol and then recrystallized, 2,3-bis(4-fluorophenyl)-5-methyl-5,6-dihydropyrazine is obtained (light yellow powder, yield: 86%).

Then, with ethanol as a solvent, 5.29 g of the above obtained 2,3-bis(4-fluorophenyl)-5-methyl-5,6-dihydropyrazine and 6.04 g of iron (III) chloride are mixed, and then gently heated and stirred for three hours. A solid obtained by adding water to a solution after reaction is purified with a column that uses dichloromethane as a developing solvent, and a ligand referred to as 2,3-bis(4-fluorophenyl)-5-methylpyrazine (abbreviation: HFdppr-Me) is obtained (milky white powder, yield: 72%). A synthesis scheme (b-1) relating to the synthesis of Step 1 is shown below.

(b-1)

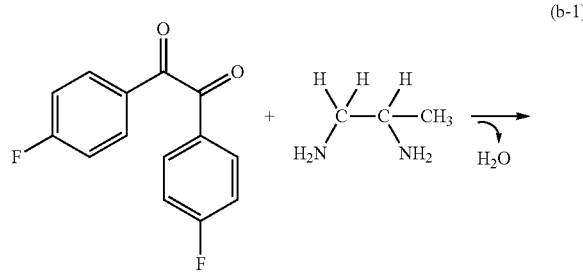

[Step 2: Synthesis of a Dinuclear Complex (Abbreviated as: [Ir(Fdppr-Me)₂Cl]₂)]

Subsequently, with a mixture of 30 ml of 2-ethoxyethanol and 10 ml of water as a solvent, 3.75 g of a ligand HFdppr-Me and 1.59 g of iridium (III) chloride hydrochloride hydrate (IrCl₃.HCl.H₂O) (by Sigma-Aldrich) are mixed. The mixture is refluxed in a nitrogen atmosphere for 16 hours, and a dinuclear complex [Ir(Fdppr-Me)₂Cl]₂ is obtained (reddish brown powder, yield: 87%). A synthesis scheme (b-2) relating to the synthesis of Step 2 is shown below.

(b-2)

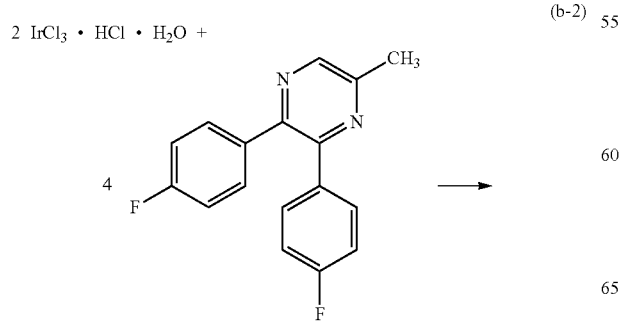

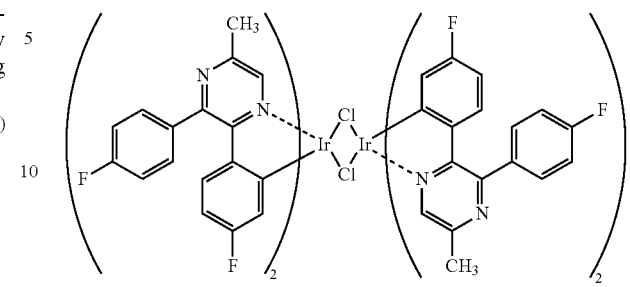

[Step 3: Synthesis of an Organometallic Complex of the Present Invention (Abbreviated as: [Ir(Fdppr-Me)₂(acac)])]

Further, with 30 ml of 2-ethoxyethanol as a solvent, 1.91 g of the above obtained [Ir(Fdppr-Me)₂Cl]₂, 0.37 ml of acetylacetone (abbreviated as: Hacac), and 1.28 g of sodium carbonate are mixed, and then refluxed under a nitrogen atmosphere for 16 hours, and a yellowish orange powder is obtained (yield: 34%). A synthesis scheme (b-3) relating to the synthesis of Step 3 is shown below.

(b-3)

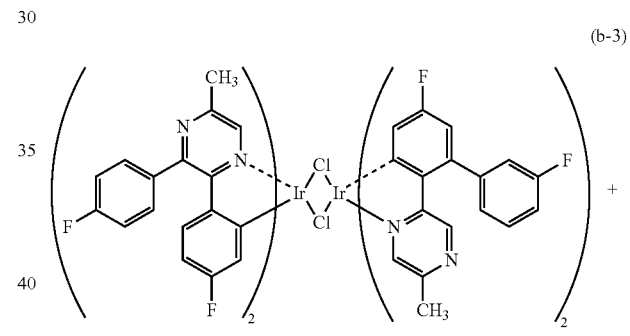

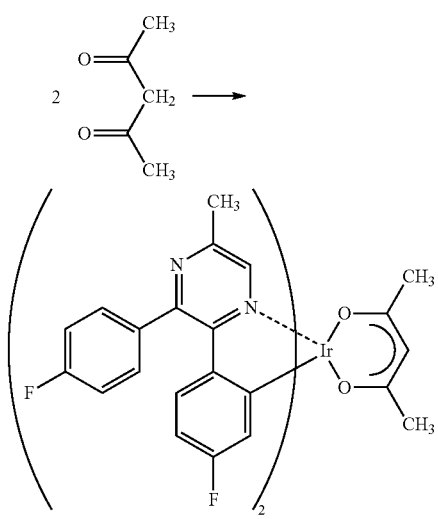

The obtained yellowish orange powder is analyzed by nuclear magnetic resonance spectroscopy ($^1$H-NMR) and a result as shown below is obtained. The product is identified to be Ir(Fdppr-Me)$_2$(acac) represented by Structural Formula (16).

$^1$H-NMR. δ(CDCl$_3$): 8.27 (s, 2H), 7.66 (dd, 4H), 7.22 (m, 4H), 6.78 (dd, 2H), 6.26 (td, 2H), 5.92 (dd, 2H), 5.31 (s, 1H), 2.70 (s, 6H), 1.89 (s, 6H)

In addition, when a decomposition temperature T$_d$ of the obtained organometallic complex Ir(Fdppr-Me)$_2$(acac) of the present invention is measured by a thermo-gravimetric/differential thermal analyzer (by Seiko Instruments Inc., type: TG/DTA-320), T$_d$=291° C., and it is observed that the Ir(Fdppr-Me)$_2$(acac) shows favorable heat resistance.

Subsequently, Ir(Fdppr-Me)$_2$(acac) is dissolved in a dichloromethane solution, and then measurement of an emission spectrum (using a fluorometer by Hamamatsu Photonics K.K., FS 920) is conducted. As a result, the emission spectrum of Ir(Fdppr-Me)$_2$(acac) shows an emission peak at 564 nm, and emitted light is yellow.

Synthesis Example 2

A synthesis method for an organometallic complex Ir(Fdppr-iPr)$_2$(pic) represented in Structural Formula (32) that is used in Embodiment 1, which is the organometallic complex represented in General Formula (1) is described.

[Step 1: Synthesis of a Ligand (Abbreviated as: HFdppr-iPr)]

First, 150 ml of dehydrated ethanol is mixed with 5.36 g of 4,4'-difluorobenzil (by Tokyo Chemical Industry Co., Ltd.) and 1.31 g of anhydrous ethylenediamine (by Tokyo Chemical Industry Co., Ltd.), and the mixture is refluxed and is reacted under a nitrogen atmosphere for three hours. After cooling a reaction solution to room temperature, 1.60 g of acetone and 1.47 g of potassium hydroxide are added into the reaction solution, and the reaction solution is refluxed and is reacted under a nitrogen atmosphere for six hours. After reaction, water is added to the reaction solution, and an organic layer is extracted by using ethyl acetate. The obtained organic layer is dried with sodium sulfate and filtered, and then solvent included in filtrate was removed. An obtained residue is purified by silica gel column chromatography that uses dichloromethane as a developing solvent, and 4.00 g of a ligand referred to as 2,3-bis(4-fluorophenyl)-5-isopropylpyrazine (HFdppr-iPr) is obtained (lightly yellow oily matter, yield: 59%). A synthesis scheme (c-1) relating to the synthesis of Step 1 is shown below.

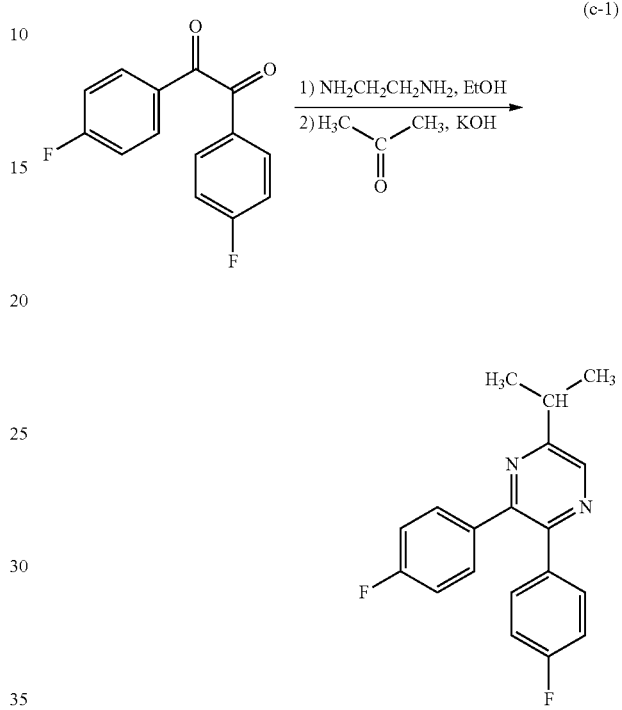

(c-1)

[Step 2: Synthesis of a Dinuclear Complex (Abbreviated as: [Ir(Fdppr-iPr)$_2$Cl]$_2$)]

Subsequently, in a mixture solvent in which 30 ml of 2-ethoxyethanol and 10 ml of water are mixed, 4.00 g of HFdppr-iPr that is the ligand obtained in Step 1 and 1.61 g of iridium (III) chloride hydrate (IrCl$_3$.H$_2$O) (produced by Sigma-Aldrich) are mixed. The mixture is refluxed under a nitrogen atmosphere for 19 hours to obtain a dinuclear complex [Ir(Fdppr-iPr)$_2$Cl]$_2$ (orange powder, yield: 72%). A synthesis scheme (c-2) relating to the synthesis of Step 2 is shown below.

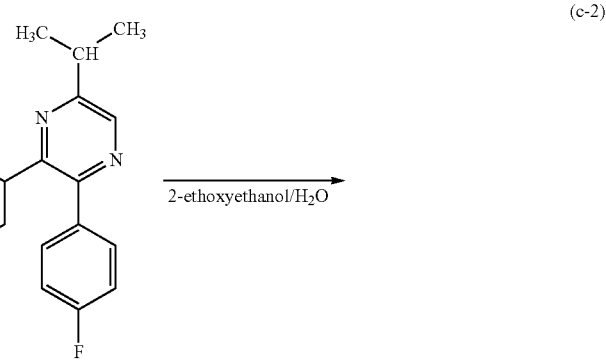

(c-2)

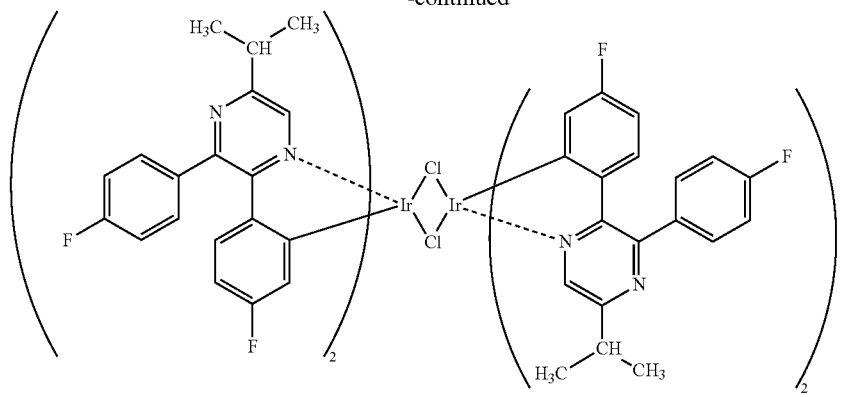

[Step 3: Synthesis of an Organometallic Complex of the Present Invention (Abbreviated as: Ir(Fdppr-iPr)₂(pic))]

Further, 25 ml of dichloromethane is mixed with 1.61 g of the dinuclear complex [Ir(Fdppr-iPr)₂Cl]₂)] obtained in Step 2 and 0.94 g of picolinic acid. The mixture is refluxed under a nitrogen atmosphere for 18 hours to obtain a bright yellow powder (yield: 90%). A synthesis scheme (c-3) relating to the synthesis of Step 3 is shown below.

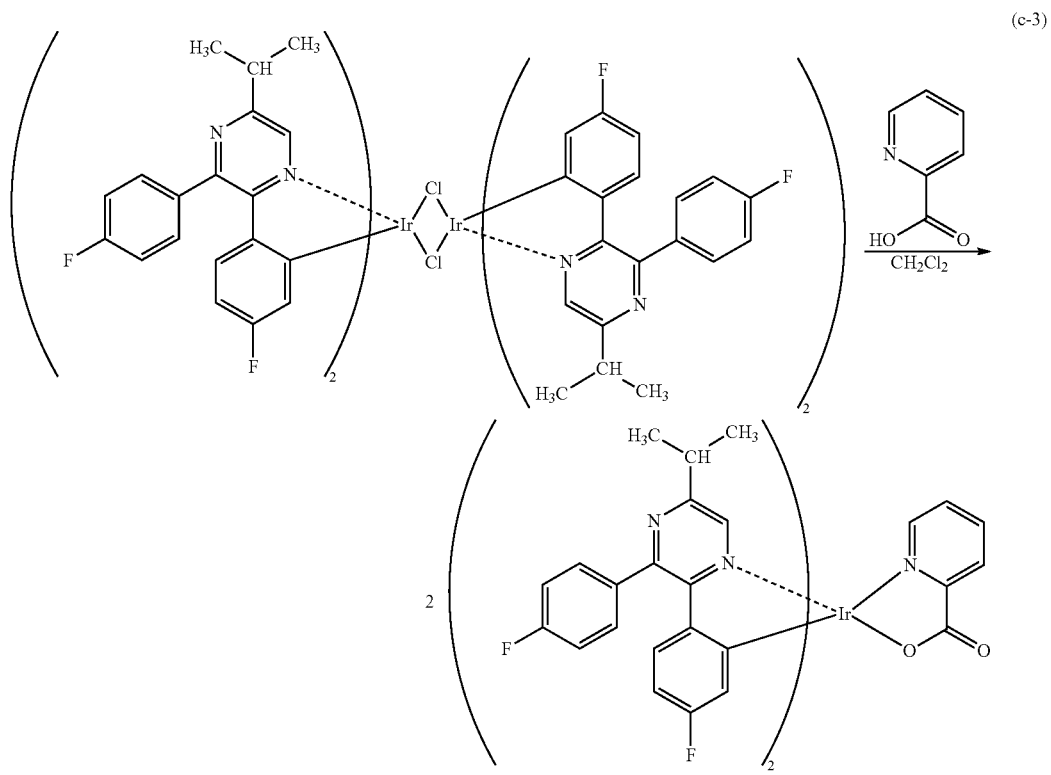

(c-3)

The obtained bright yellow powder is analyzed by nuclear magnetic resonance spectroscopy (¹H-NMR) and a result as shown below is obtained. The product is identified to be Ir(Fdppr-iPr)₂(pic) represented by Structural Formula (32) which is one of organometallic complexes of the present invention.

¹H-NMR. δ(CDCl₃): 1.15 (d, 6H), 1.32 (t, 6H), 2.93 (quin, 1H), 3.16 (quin, 1H), 5.82 (dd, 1H), 6.07 (dd, 1H), 6.31 (td, 1H), 6.38 (td, 1H), 6.85 (dd, 1H), 6.92 (dd, 1H), 7.11-7.32 (m, 5H), 7.53 (m, 1H), 7.59-7.69 (m, 4H), 7.80 (d, 1H), 8.05 (td, 1H), 8.43 (d, 1H), 8.60 (s, 1H)

In addition, when a decomposition temperature $T_d$ of the obtained organometallic complex Ir(Fdppr-iPr)₂(pic) of the present invention is measured by TG/DTA (a thermo-gravimetric/differential thermal analyzer by Seiko Instruments Inc., type: TG/DTA-320), $T_d$=348° C., and it is observed that Ir(Fdppr-iPr)₂(pic) shows favorable heat resistance.

Subsequently, Ir(Fdppr-iPr)₂(pic) is dissolved in a dichloromethane solution, and an emission spectrum is measured (using a fluorometer by Hamamatsu Photonics KK., FS 920). As a result, the emission spectrum of Ir(Fdppr-iPr)₂(pic) shows a peak at 559 nm, and emitted light is yellow.

This application is based on Japanese Patent Application serial No. 2005-148777 field in Japan Patent Office on May 20, 2005, the entire contents of which are hereby incorporated by reference.

What is claimed is:

1. A light emitting device comprising:
a light emitting layer between a first electrode and a second electrode;
a hole transporting layer between the first electrode and the light emitting layer;
an electron transporting layer between the second electrode and the light emitting layer; and
a mixed layer comprising an electron transporting material and an electron donating material between the electron transporting layer and the second electrode,
wherein the mixed layer is separated from the light emitting layer by the electron transporting layer interposed therebetween,
wherein the electron transporting layer includes a same material as the electron transporting material in the mixed layer, and
wherein the light emitting layer comprises a host material and an organometallic complex, the organometallic complex comprising:
an iridium metal;
a first ligand and a second ligand, each comprising:
a first ring comprising a first nitrogen, a second nitrogen, and a first to fourth carbon, wherein the first nitrogen binds with the first carbon and the fourth carbon, the second nitrogen binds with the second carbon and the third carbon, the first carbon binds with the second carbon, and the third carbon binds with the fourth carbon;
a second ring comprising a first to sixth carbon, wherein the first carbon binds with the second carbon and the sixth carbon, the fourth carbon binds with the third carbon and the fifth carbon, the second carbon binds with the third carbon, the fifth carbon binds with the sixth carbon, and the third carbon, the fifth carbon, and the sixth carbon bind with a first to third hydrogen, respectively;
a third ring comprising a first to sixth carbon, wherein the first carbon binds with the second carbon and the sixth carbon, the fourth carbon binds with the third carbon and the fifth carbon, the second carbon binds with the third carbon, the fifth carbon binds with the sixth carbon, and the second carbon, the third carbon, the fifth carbon, and the sixth carbon bind with a first to fourth hydrogen, respectively;
wherein the first ring is a hetero aromatic ring, and
wherein each of the second ring and the third ring is an aromatic ring,
R1 representing an electron-drawing group;
R2 representing an electron-drawing group;
R3 representing any one of a hydrogen and an alkyl group having 1 to 4 carbon atoms; and
R4 representing any one of a hydrogen and an alkyl group having 1 to 4 carbon atoms,
wherein the first carbon of the first ring binds with the first carbon of the second ring,
wherein the second carbon of the first ring binds with the first carbon of the third ring,
wherein the R1 binds with the fourth carbon of the third ring,
wherein the R2 binds with the fourth carbon of the second ring,
wherein the R3 binds with the third carbon of the first ring, and
wherein the R4 binds with the fourth carbon of the first ring; and
L representing a monoanionic ligand,
wherein the first ligand, the second ligand, and the L are bound to the iridium metal between the iridium metal and the first nitrogen of the first ring and the second carbon of the second ring of the first ligand, the first nitrogen of the first ring and the second carbon of the second ring of the second ligand, and the L to form the organometallic complex.

2. A light emitting device according to claim 1, further comprising:
a hole injection layer between the first electrode and the hole transporting layer.

3. A light emitting device according to claim 1, wherein an absolute value of a difference in ionization potential between the hole transporting layer and the host material is 0.4 eV or lower.

4. A light emitting device according to claim 1, wherein an excitation energy of the hole transporting layer is larger than an excitation energy of the host material.

5. A light emitting device according to claim 1, wherein t an absolute value of a difference in electron affinity between the electron transporting layer and the host material is 0.5 eV or lower.

6. A light emitting device according to claim 1, wherein the electron donating material is an alkali metal or an alkaline earth metal.

7. A light emitting device according to claim 1,
wherein the host material is any one substance selected from a group consisting of 4,4'-bis(N-carbazolyl)biphenyl (CBP), 4,4',4''-tris(N-carbazolyl)triphenylamine (TCTA), 4,4'-bis[N-(1-naphthyl)-N-phenylamino]biphenyl (NPB), bis[2-(2-hydroxyphenyl)pyridinato]zinc (Znpp2), and bis[2-(2-hydroxyphenyl)benzoxazolato]zinc (ZnBOX),
wherein the hole transporting layer includes any one substance selected from a group consisting of 4,4'-bis[N-(1-naphthyl)-N-phenylamino]biphenyl (NPB), 4,4'-bis[N-(3-methylphenyl)-N-phenylamino]biphenyl (TPD), 1,3,5-tris[N,N-di(m-toly)amino]benzene (m-MTDAB), and 4,4',4''-tris(N-carbazolyl)triphenylamine (TCTA), and
wherein the electron transporting layer includes any one substance selected from a group consisting of bathocuproin (BCP), 3-(4-tert-butylphenyl)-4-phenyl-5-(4-biphenylyl)-1,2,4-triazole (TAZ), bis[2-(2-hydroxyphenyl)benzoxazolato]zinc (Zn(BOX)2), 1,3-bis[5-(p-tert-butylphenyl)-1,3,4-oxadiazole-2-yl]benzene (OXD-7), 3-(4-tert-butylphenyl)-4-(4-ethylphenyl)-5-(4-biphenylyl)-1,2,4-triazole (p-EtTAZ), and bathophenanthroline (BPhen).

8. A light emitting device according to claim 1, wherein the electron-drawing group is any group selected from a halogen group, a-CF3 group, a cyano group, and an alkoxycarbonyl group.

9. An electronic appliance comprising a light emitting device according to claim 1.

10. A light emitting device comprising:
a light emitting layer between a first electrode and a second electrode;
a hole transporting layer between the first electrode and the light emitting layer;
an electron transporting layer between the second electrode and the light emitting layer; and a mixed layer comprising an electron transporting material and an electron donating material between the electron transporting layer and the second electrode, wherein the mixed layer is separated from the light emitting layer by the electron transporting layer interposed therebetween, wherein the electron transporting layer includes a same material as the electron transporting material in the mixed layer, and wherein the light emitting layer comprises a host material and an organometallic complex, the organometallic complex comprising:

an iridium metal;

a first ligand and a second ligand, each comprising:

a first ring comprising a first nitrogen, a second nitrogen, and a first to fourth carbon, wherein the first nitrogen binds with the first carbon and the fourth carbon, the second nitrogen binds with the second carbon and the third carbon, the first carbon binds with the second carbon, and the third carbon binds with the fourth carbon;

a second ring comprising a first to sixth carbon, wherein the first carbon binds with the second carbon and the sixth carbon, the fourth carbon binds with the third carbon and the fifth carbon, the second carbon binds with the third carbon, the fifth carbon binds with the sixth carbon, and the third carbon, the fifth carbon, and the sixth carbon bind with a first to third hydrogen, respectively;

a third ring comprising a first to sixth carbon, wherein the first carbon binds with the second carbon and the sixth carbon, the fourth carbon binds with the third carbon and the fifth carbon, the second carbon binds with the third carbon, the fifth carbon binds with the sixth carbon, and the second carbon, the third carbon, the fifth carbon, and the sixth carbon bind with a first to fourth hydrogen, respectively;

wherein the first ring is a hetero aromatic ring, and wherein each of the second ring and the third ring is an aromatic ring, R1 representing an fluorine;

R2 representing an fluorine;

R3 representing a carbon and three hydrogens; and

R4 representing a hydrogen, wherein the first carbon of the first ring binds with the first carbon of the second ring, wherein the second carbon of the first ring binds with the first carbon of the third ring, wherein the R1 binds with the fourth carbon of the third ring, wherein the R2 binds with the fourth carbon of the second ring, wherein the R3 binds with the third carbon of the first ring, and wherein the R4 binds with the fourth carbon of the first ring; and a third ligand comprising a first to fifth carbon, a first oxygen, and a second oxygen, wherein the second carbon binds with the first carbon, the third carbon, and the first oxygen, the fourth carbon binds with the third carbon, the fifth carbon, and the second oxygen, and each of the first carbon and the fifth carbon binds with three hydrogens, wherein the first to third ligand are bound to the iridium metal between the iridium metal and the first nitrogen of the first ring and the second carbon of the second ring of the first ligand, the first nitrogen of the first ring and the second carbon of the second ring of the second ligand, and the first oxygen and the second oxygen of the third ligand to form the organometallic complex.

11. A light emitting device according to claim 10, further comprising:

a hole injection layer between the first electrode and the hole transporting layer.

12. A light emitting device according to claim 10, wherein an absolute value of a difference in ionization potential between the hole transporting layer and the host material is 0.4 eV or lower.

13. A light emitting device according to claim 10, wherein an excitation energy of the hole transporting layer is larger than an excitation energy of the host material.

14. A light emitting device according to claim 10, wherein an absolute value of a difference in electron affinity between the electron transporting layer and the host material is 0.5 eV or lower.

15. A light emitting device according to claim 10, wherein the electron donating material is an alkali metal or an alkaline earth metal.

16. A light emitting device according to claim 10, wherein the host material is any one substance selected from a group consisting of 4,4'-bis(N-carbazolyl)biphenyl (CBP), 4,4',4''-tris(N-carbazolyl)triphenylamine (TCTA), 4,4'-bis[N-(1-naphthyl)-N-phenylamino]biphenyl (NPB), bis[2-(2-hydroxyphenyl)pyridinato]zinc (Znpp2), and bis[2-(2-hydroxyphenyl)benzoxazolato]zinc (ZnBOX), wherein the hole transporting layer includes any one substance selected from a group consisting of 4,4'-bis[N-(1-naphthyl)-N-phenylamino]biphenyl (NPB), 4,4'-bis[N-(3-methylphenyl)-N-phenylamino]biphenyl (TPD), 1,3,5-tris[N,N-di(m-toly)amino]benzene (m-MTDAB), and 4,4',4''-tris(N-carbazolyl)triphenylamine (TCTA), and wherein the electron transporting layer includes any one substance selected from a group consisting of bathocuproin (BCP), 3-(4-tert-butylphenyl)-4-phenyl-5-(4-biphenylyl)-1,2,4-triazole (TAZ), bis[2-(2-hydroxyphenyl)benzoxazolato]zinc (Zn(BOX)2), 1,3-bis[5-(p-tert-butylphenyl)-1,3,4-oxadiazole-2-yl]benzene (OXD-7), 3-(4-tert-butylphenyl)-4-(4-ethylphenyl)-5-(4-biphenylyl)-1,2,4-triazole (p-EtTAZ), and bathophenanthroline (BPhen).

17. An electronic appliance comprising a light emitting device according to claim 10.

UNITED STATES PATENT AND TRADEMARK OFFICE
CERTIFICATE OF CORRECTION

PATENT NO. : 9,257,657 B2
APPLICATION NO. : 13/156506
DATED : February 9, 2016
INVENTOR(S) : Nobuharu Ohsawa et al.

Page 1 of 1

It is certified that error appears in the above-identified patent and that said Letters Patent is hereby corrected as shown below:

In the Specification:

Column 6, Line 27; Change "{N[4" to --{N-[4--.

Column 24, Line 24; Change "Circuit" to --circuit--.

Column 26, Line 62; Change "faulted" to --formed--.

Column 33, Line 50; Change "(IrCl$_3$.HCl.H$_2$O)" to --(IrCl$_3$·HCl·H$_2$O)--.

Column 36, Line 46; Change "(IrCl$_3$.H$_2$O)" to --(IrCl$_3$·H$_2$O)--.

Column 38, Line 65; Change "KK.," to --K.K.,--.

In the Claims:

Column 40, Line 43, Claim 7; Change "(m-toly)" to --(m-tolyl)--.

Column 42, Line 43, Claim 16; "(m-toly)" to --(m-tolyl)--.

Signed and Sealed this
Twenty-sixth Day of July, 2016

Michelle K. Lee
*Director of the United States Patent and Trademark Office*